United States Patent [19]
Seki et al.

[11] Patent Number: 5,438,600
[45] Date of Patent: Aug. 1, 1995

[54] ODD-NUMBER FREQUENCY DIVIDER AND METHOD OF CONSTITUTING THE SAME

[75] Inventors: Fusao Seki; Masato Abe, both of Kawasaki, Japan

[73] Assignee: Fujitsu Limited, Kawasaki, Japan

[21] Appl. No.: 155,824

[22] Filed: Nov. 23, 1993

[30] Foreign Application Priority Data

Dec. 3, 1992 [JP] Japan .................. 4-324373

[51] Int. Cl.$^6$ .................................. H03K 21/00
[52] U.S. Cl. ............................................ 377/47
[58] Field of Search ................................ 377/47

[56] References Cited

U.S. PATENT DOCUMENTS

| | | | |
|---|---|---|---|
| 5,127,036 | 6/1992 | Pham | 377/47 |
| 5,172,400 | 12/1992 | Maemura | 377/47 |
| 5,177,771 | 1/1993 | Glassburn | 377/47 |

FOREIGN PATENT DOCUMENTS

| | | |
|---|---|---|
| 53-96657 | 8/1978 | Japan . |
| 57-26930 | 2/1982 | Japan . |
| 63-79421 | 4/1988 | Japan . |

*Primary Examiner*—Margaret Rose Wambach
*Attorney, Agent, or Firm*—Staas & Halsey

[57] ABSTRACT

A first odd-number frequency divider for frequency-dividing and outputting an input signal of optional frequency includes a counter having cascade-connected n [n=1, 2, 3] elements of flip-flop circuits for receiving an input signal and outputting a 1/[2n+1] frequency-divided signal, a register having cascade-connected n [n=1, 2, 3] elements of flip-flop circuits for shifting the 1/[2n+1] frequency-divided signal successively synchronously with the input signal, a latch circuit for holding a register output signal of the [n-1]th flip-flop circuit of the register synchronously with an inverted signal of the input signal, and a logic circuit for receiving an inverted latch output signal outputted from the latch circuit and a register output signal of the nth flip-flop circuit and outputting the 1/[2n+1] frequency-divided signal. A second odd-number frequency divider for frequency-dividing and outputting an input signal of optional frequency includes a counter having cascade-connected m [m=3 to m] elements of flip-flop circuits for receiving an input signal and outputting a 1/[2m+1] frequency-divided signal, a register having cascade-connected [m+1] elements of flip-flop circuits for shifting the 1/[2m+1] frequency-divided signal successively synchronously with the input signal, a latch circuit for holding a register output signal of the mth flip-flop circuit synchronously with an inverted signal of the input signal, and a logic circuit for receiving an inverted latch output signal outputted from the latch circuit and a register output signal of the [m+1]th flip-flop circuit and outputting the 1/[2m+1] frequency-divided signal.

16 Claims, 24 Drawing Sheets (Prior Art) CK (Prior Art) QA (Prior Art) QB $K = \frac{B}{A} = \frac{1}{3} = 0.33$ FIG. 3
(Prior Art)
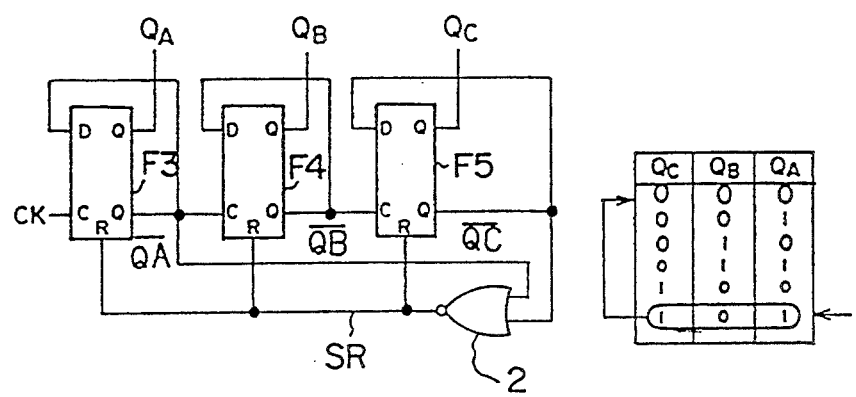
FIG. 4(A)
(Prior Art) CK
FIG. 4(B)
(Prior Art) QA
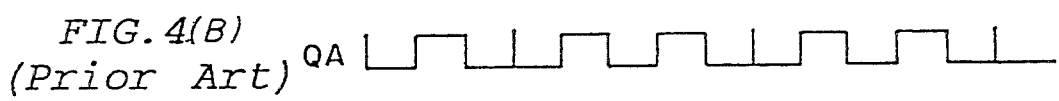
FIG. 4(C)
(Prior Art) QB
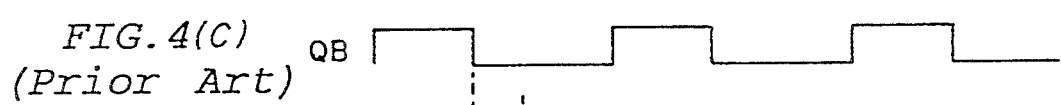
FIG. 4(D)
(Prior Art) QC
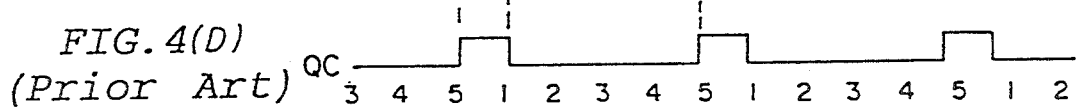
$$K = \frac{B}{A} = \frac{1}{5} = 0.20$$
(b)

FIG. 7
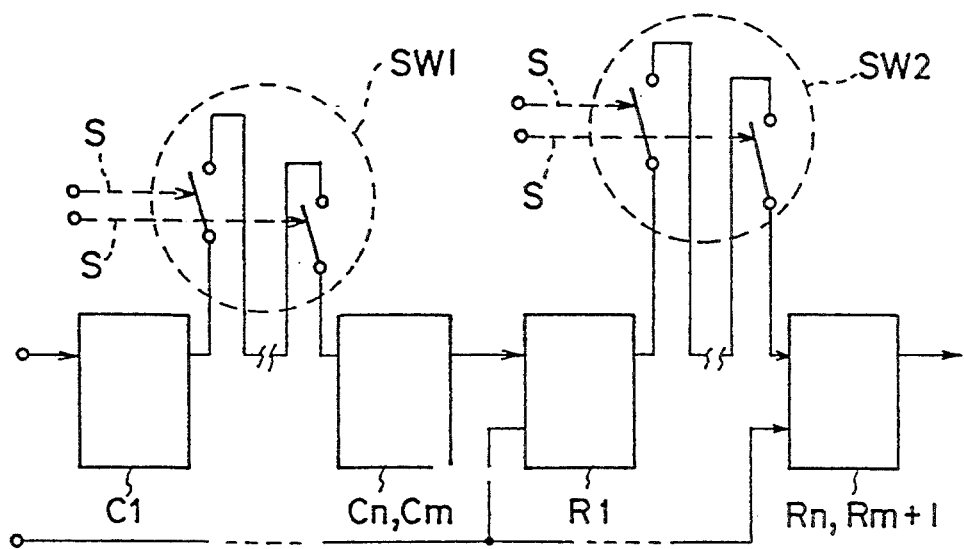
FIG. 8(A)
FIG. 8(B)
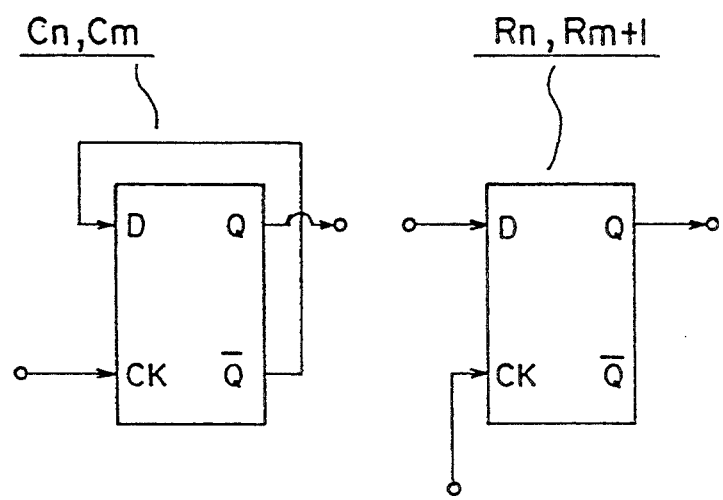

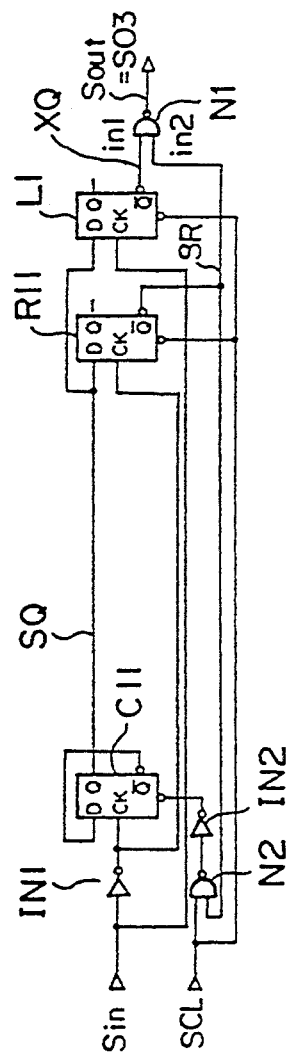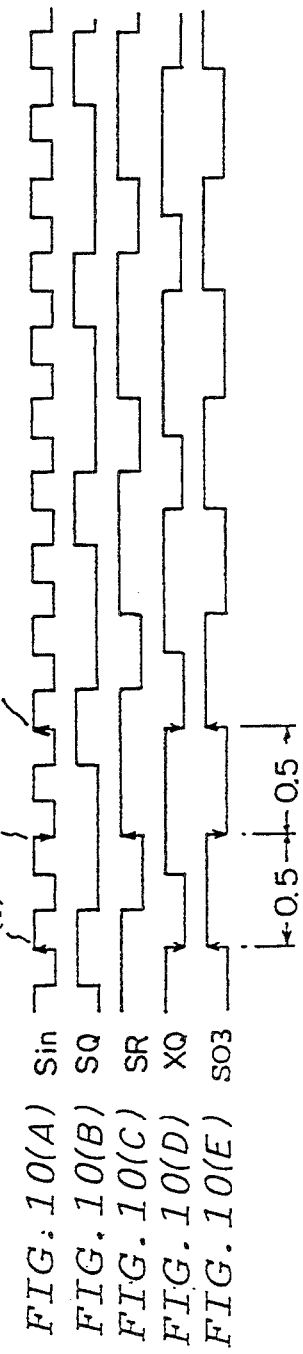
FIG. 9
FIG. 10(A) Sin
FIG. 10(B) SQ
FIG. 10(C) SR
FIG. 10(D) XQ
FIG. 10(E) SO3

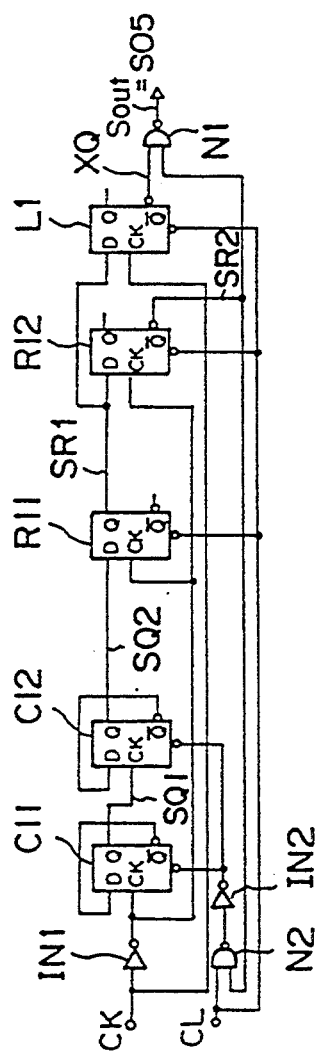
FIG. 11
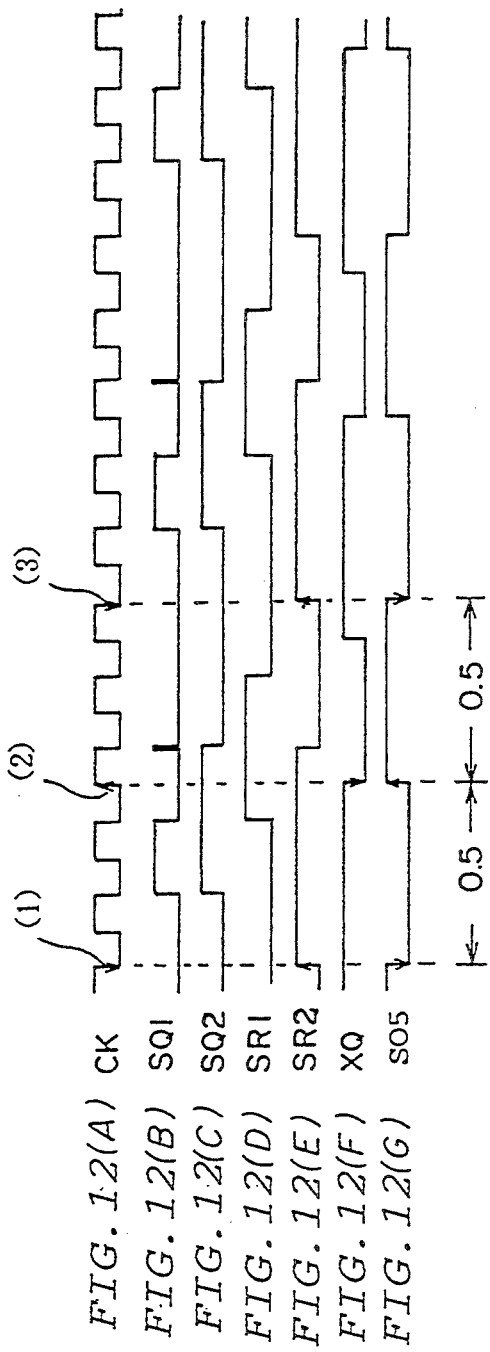
FIG. 12(A) CK
FIG. 12(B) SQ1
FIG. 12(C) SQ2
FIG. 12(D) SR1
FIG. 12(E) SR2
FIG. 12(F) XQ
FIG. 12(G) SO5

FIG. 22(A) Sin
FIG. 22(B) SCL
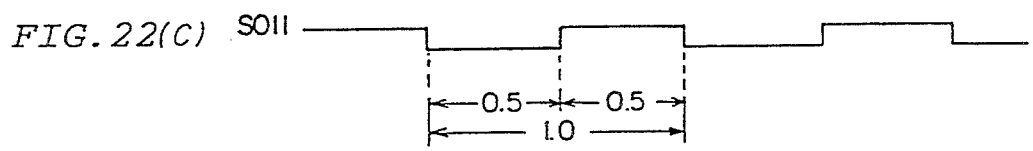
FIG. 22(C) SO11
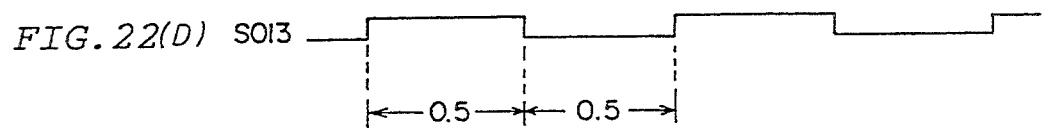
FIG. 22(D) SO13
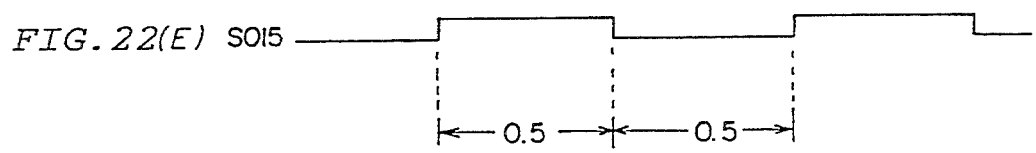
FIG. 22(E) SO15
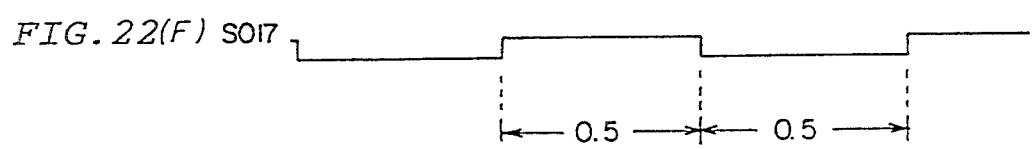
FIG. 22(F) SO17
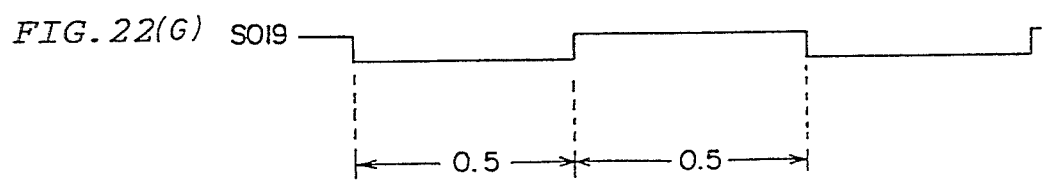
FIG. 22(G) SO19

FIG. 24(A) CK 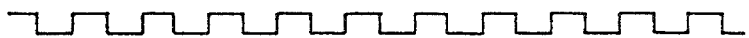
FIG. 24(B) CL 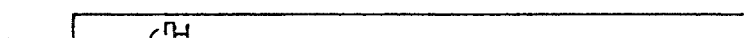

FIG. 24(F) SO3 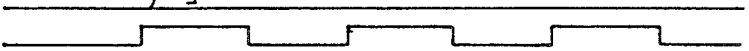
FIG. 25(A) CK 
FIG. 25(B) CL 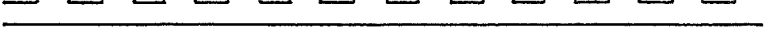

FIG. 25(F) SO5 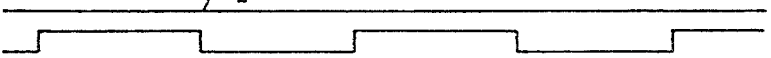
FIG. 26(A) CK 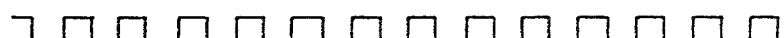
FIG. 26(B) CL 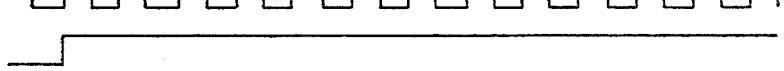

FIG. 26(F) SO7 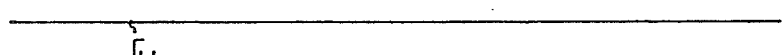

ODD-NUMBER FREQUENCY DIVIDER AND METHOD OF CONSTITUTING THE SAME

BACKGROUND OF THE INVENTION

1. Field of the Invention

The present invention relates to an odd-number frequency divider for frequency dividing an input signal of optional frequency, and more particularly to a frequency divider for outputting a digital frequency-divided signal having a frequency division ratio of 1/[2n+1] (n is an integral number) and a duty ratio of 50% with respect to the input signal and a method of constituting the frequency divider.

2. Description of the Related Art

In recent years, an integrated circuit for receiving a clock signal of high frequency and operating at a high speed is designed with the demand for high performance and high function of an information processing unit. An odd-number frequency divider circuit generating a digital frequency-divided signal having a frequency division ratio of 1/[2n+1] is incorporated in the integrated circuit concerned. This digital frequency-divided signal is used, for example, for timing control of various function circuits.

Here, a prior art related to the present invention will be described. For example, a ternary counter is composed of flip-flop circuits F1 and F2 and a two-input NOR circuit 1 as shown in FIG. 1. The ternary counter receives a clock signal CK and outputs a non-inverted counter output signal (hereinafter referred to simply as a non-inverted output signal QB) of a one-third frequency division ratio.

Namely, the function of the circuit concerned is such that a non-inverted output signal QA is generated when the clock signal CK is frequency-divided into one half by the flip-flop circuit F1 as shown in a truth table in FIG. 1 and an operational waveform diagram in FIG. 2. Further, in the flip-flop circuit F2, an inverted counter output signal (hereinafter referred to simply as an inverted output signal QA) is received and a non-inverted output signal QB is generated.

The inverted output signal QA of the flip-flop circuit F1 and the inverted output signal QB of the flip-flop circuit F2 are inputted to the NOR circuit 1. With this, a reset signal SR is generated from the NOR circuit 1. This reset signal SR is supplied to the flip-flop circuits F1 and F2.

Thus, a non-inverted output signal QB such as shown in FIG. 2C is outputted from the flip-flop circuit F2. This signal QB has a frequency division ratio at ⅓ and a duty ratio K at approximately 33%. Here, it is assumed that the duty ratio K means a ratio of a period of an "H" level or a period B of an "L" level to one period (A=1) of the object signal.

Further, a quinary counter related to a conventional example is composed of flip-flop circuits F3, F4 and F5 and a NOR circuit 2 as shown in FIG. 3. For example, the quinary counter receives a clock signal CK and outputs a non-inverted output signal QC. The signal QC concerned has a one-fifth frequency division ratio.

Namely, the function of the counter concerned is such that a non-inverted output signal QA is generated when the clock signal CK is frequency-divided into one half by the flip-flop circuit F3 as shown in a truth table in FIG. 3 and an operational waveform diagram in FIG. 4. Further, when the inverted output signal QA is inputted to the flip-flop circuit F4, a non-inverted output signal QB is generated.

When the inverted output signal QB is inputted to the flip-flop circuit F5, a non-inverted output signal QC is generated. When the inverted output signal QA of the flip-flop circuit F3 and the inverted output signal QC of the flip-flop circuit F5 are supplied to the NOR circuit 2, a reset signal SR is generated. This reset signal SR is supplied to the flip-flop circuits F3, F4 and F5.

With this, the non-inverted output signal QC as shown in FIG. 4D is outputted from the flip-flop circuit F5. The signal QC has a frequency division ratio of 1/5 and a duty ratio K of 20%. In the ternary counter and the quinary counter according to a conventional example, however, it is impossible to obtain a digital frequency-divided signal having a duty ratio of 50%.

Next, a structural example of an odd-number frequency divider for outputting a digital frequency-divided signal having a duty ratio of 50% will be presented. A digital frequency division circuit is disclosed in Provisional Publication No. SHO53-96657 laid open by the Japanese Patent Office. The frequency division circuit concerned is composed of 1/[2n+1] frequency division counter and a flip-flop circuit.

Similarly, an odd-number frequency division circuit is disclosed in Provisional Publication No. SHO57-26930. The frequency division circuit is composed of a shift register, a flip-flop circuit and a logic circuit.

Similarly, an odd-number frequency divider is disclosed in Provisional Publication No. SHO63-79421. The frequency divider concerned is composed of a counter circuit, a shift register, a logic circuit and a ½ frequency division circuit.

SUMMARY OF THE INVENTION

It is an object of the present invention to constitute an odd-number frequency divider for outputting a digital frequency-divided signal with 50% duty ratio having a frequency division ratio of 1/[2n+1] (n=an integral number).

It is another object of the present invention to constitute an odd-number frequency divider easily by arranging a plurality of flip-flop circuits for forming a counter and flip-flop circuits for forming a register and selecting the number thereof in accordance with a requirement for design. In other words, it is to constitute a programmable odd-number frequency divider.

It is still another object of the present invention to constitute a general use type odd-number frequency divider capable of coping with design change quickly and rich in flexibility and conformity.

Namely, a first odd-number frequency divider according to the present invention has n (n=1, 2, 3) elements of flip-flop circuits forming a counter, n pieces of flip-flop circuits forming a register, one element of latch circuit and logic circuit as shown with a preferred embodiment thereof in FIG. 3. An input signal of optional frequency is inputted in the first flip-flop circuit for forming a counter, and the inverted input signal thereof is supplied to the latch circuit.

Further, when an inverted output signal outputted from the latch circuit and an inverted output signal outputted from the nth flip-flop circuit for forming a register are inputted to a logic circuit, it becomes possible to obtain a digital frequency-divided signal having frequency division ratios of ⅓, ⅕ and ⅐ and a 50% duty ratio.

Furthermore, a second odd-number frequency divider according to the present invention has m (m=3→m) elements of flip-flop circuits forming a counter, m+1 pieces of flip-flop circuits forming a register, one element of latch circuit and logic circuit as shown with a preferred embodiment thereof in FIG. 6. An input circuit of optional frequency is inputted to the first flip-flop circuit for forming a counter, and an inverted input signal thereof is supplied to the latch circuit.

Further, when an inverted output signal outputted from the latch circuit and an inverted output signal outputted from the mth flip-flop circuit are inputted to the logic circuit, it becomes possible to obtain a digital frequency-divided signal with a frequency division ratio of 1/[2m+1] such as 1/9, 1/11, 1/13 etc. and a 50% duty ratio.

Furthermore, in a third odd-number frequency divider according to the present invention, switching elements are connected among n pieces of flip-flop circuits for forming a counter and among m elements of flip-flop circuits for forming a register as shown with a preferred embodiment in FIG. 7.

As a result, when a program control signal for forming 1/[2n+1] frequency division is supplied to the switching elements, an output terminal of the flip-flop circuit for forming a counter and an input terminal of another flip-flop circuit are connected to each other. Similarly, an output terminal of the flip-flop circuit for forming a register and an input terminal of another flip-flop circuit are connected to each other automatically.

With this, it is possible to select the number of installation of the flip-flop circuits for forming a counter and the flip-flop circuits for forming a register automatically in accordance with a design requirement, thus making it possible to easily constitute an odd-number frequency divider for outputting a digital frequency-divided signal having a frequency division ratio of 1/[2n+1] and a 50% duty ratio.

Furthermore, in a method of constituting an odd-number frequency divider according to the present invention, n pieces of flip-flop circuits for forming a counter with a data input terminal and a data inverted output terminal connected to each other and with a clock input terminal and a data non-inverted output terminal opened and n pieces of flip-flop circuits for forming a register with a data input terminal, a clock input terminal, a data non-inverted output terminal and a data inverted output terminal opened are arranged in advance on the same chip.

These are connected by a metal interconnection process or the like in accordance with a design requirement. In the concrete, clock non-inverted output terminals and clock input terminals among n pieces of flip-flop circuits for forming a counter are connected, respectively. Further, data non-inverted output terminals and data input terminals among n elements of flip-flop circuits for forming a register are connected, respectively. The clock input terminals of n pieces of the nth flip-flop circuit for forming a register are connected to a clock supply line, respectively.

The data non-inverted output terminal of the nth flip-flop circuit for forming a counter is connected to the data input terminal of the first flip-flop circuit for forming a register.

With this, it is possible to program the number of installation of the flip-flop circuits for forming a counter and the flip-flop circuits for forming a register optionally in accordance with a design requirement, and it becomes thus possible to easily constitute an odd-number frequency divider for outputting a digital frequency-divided signal with a frequency division ratio of 1/[2n+1] and a 50% duty ratio.

BRIEF DESCRIPTION OF THE DRAWINGS

FIG. 3 shows a structural diagram of a second odd-number frequency divider (a quinary counter) according to a conventional example and a truth table for explaining counter operation thereof;

FIGS. 4A–4D are operational waveform diagrams of the second odd-number frequency divider shown in FIG. 3;

FIG. 7 is a structural diagram in principle of a third odd-number frequency divider according to the present invention;

FIG. 8(A) is an explanatory diagram in principle of a flip-flop circuit for forming a counter of the first odd-number frequency divider to the third odd-number frequency divider shown in FIG. 5 to FIG. 7;

FIG. 8(B) is an explanatory diagram of a flip-flop circuit for forming a register of the first odd-number frequency divider to the third odd-number frequency divider according to the present invention shown in FIG. 5 to FIG. 7;

FIG. 9 is a structural diagram of a ⅓ frequency divider according to a first preferred embodiment of the present invention;

FIGS. 10A–10E are operational waveform diagrams of a ⅓ frequency divider according to the first embodiment of the present invention shown in FIG. 9;

FIG. 11 is a structural diagram of a 1/5 frequency divider according to the first preferred embodiment of the present invention;

FIG. 12 is an operational waveform diagram of the 1/5 frequency divider according to the first embodiment of the present invention shown in FIG. 11;

FIGS. 22A–22G is a waveform diagram for explaining the relationship between the input signal and the output signal of the 1/11 frequency divider to the 1/19 frequency divider according to the second embodiment of the present invention;

FIGS. 24A–24F is a waveform diagram for explaining the relationship between the input signal and the output signal at time of programming (⅓) according to the third preferred embodiment of the present invention;

FIGS. 25A–25F is a waveform diagram for explaining the relationship between the input signal and the output signal at time of programming (1/5) according to the third preferred embodiment of the present invention;

FIGS. 26A–26F is a waveform diagram for explaining the relationship between the input signal and the output signal at time of programming (1/7) according to the third preferred embodiment of the present invention;

DESCRIPTION OF THE PREFERRED EMBODIMENTS

Now, a ternary counter according to a related art of the present invention is composed of two pieces of D flip-flop circuits F1 and F2 and one piece of NOR circuit 1. Thus, it is possible to obtain a non-inverted output signal QB having a frequency division ratio of ⅓ and a duty ratio K of approximately 33%, and to aim at reduction of the ⅓ frequency divider.

Further, a quinary counter according to a related art of the present invention is composed of three pieces of D flip-flop circuits F1, F2 and F3 and one piece of NOR circuit 2. Thus, it is possible to obtain a non-inverted output signal QC having a frequency division ratio of 1/5 and a duty ratio K of 20%, and to aim at reduction of the 1/5 frequency divider.

In an odd-number frequency divider applied with a ternary counter and a quinary counter according to a related art of the present invention, however, it becomes difficult to obtain a digital frequency-divided signal (a non-inverted output signal) with a 50% duty ratio.

Further, a digital frequency division circuit for outputting a digital frequency-divided signal with a 50% duty ratio is disclosed in Provisional Publication No. SHO53-96657 laid open by the Japanese Patent Office. However, a counter circuit for outputting a $1/[2n+1]$ frequency-divided signal has to be designed originally in accordance with a design requirement.

Furthermore, an odd-number frequency division circuit for outputting a digital frequency-divided signal with a 50% duty ratio is disclosed in Provisional Publication No. SHO57-26930. However, similarly to the counter circuit of the above-mentioned digital frequency division circuit, a register circuit for outputting a $1/[2n+1]$ frequency-divided signal has to be designed originally in accordance with a design requirement.

Besides, an odd-number frequency divider for outputting a digital frequency-divided signal having a duty ratio of 50% is disclosed in Provisional Publication No. SHO63-79421. However, a circuit for frequency dividing a signal outputted from a logic circuit into one half becomes necessary.

Because of such a reason, it is impossible to cope with a design change quickly with a frequency divider applied with a counter related to an odd number of the related art of the present invention when a gate circuit or a logic circuit requiring a digital frequency-divided signal having a frequency division ratio of $1/[2n+1]$ and a duty ratio of 50% is incorporated in a semiconductor integrated circuit.

This is required for stabilization of a latch circuit or a memory element which receives a high frequency clock signal and operates at a high speed with the demand for high performance and high function of an information processing unit. In particular, the related art of the present invention lacks degree of freedom in constituting a circuit for the requirement of design change of the frequency division ratio, thus making it difficult to constitute variety of frequency dividers easily within a short period.

Figures 1, 2A, 2B, 2C:
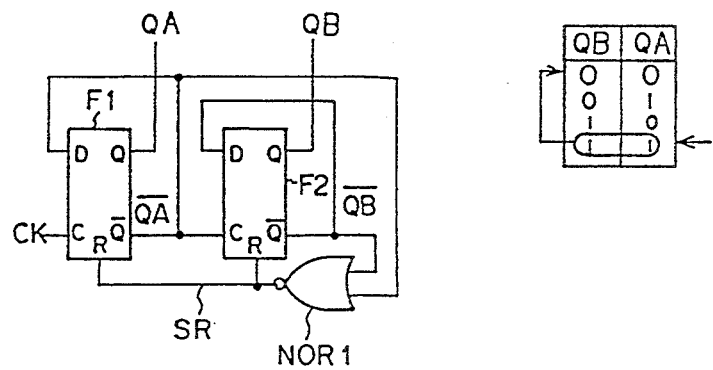
FIG. 1 shows a structural diagram of a first odd-number frequency divider (a ternary counter) according to a conventional example and a truth table for explaining counter operation thereof.
FIGS. 2A–2C are an operational waveform diagrams of the first odd-number frequency divider shown in FIG. 1.
Figure 5:
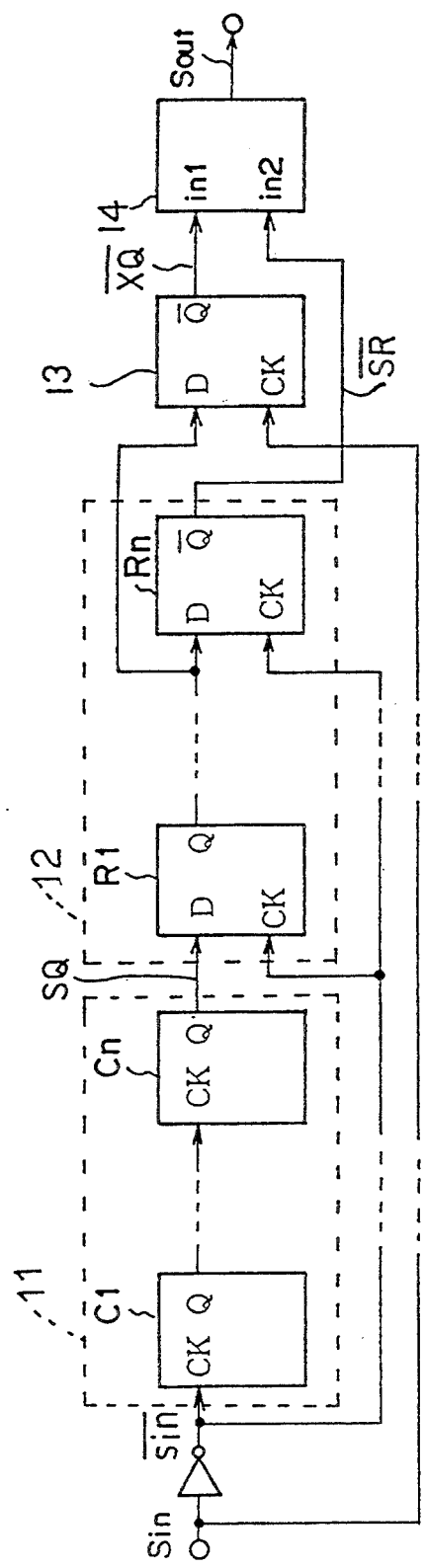
FIG. 5 is a structural diagram in principle of a first odd-number frequency divider according to the present invention.

In contrast to the above, a first odd-number frequency divider in principle of the present invention has a counter 11, a register 12, a latch circuit 13 and a logic circuit 14 as shown in FIG. 5. In the counter 11, n (n is an integral number, n=1, 2, 3) pieces of flip-flop circuits C1 to Cn are cascade-connected. The counter 11 receives an inverted input signal Sin of optional frequency and outputs a $1/[2n+1]$ frequency-divided signal SQ. In the register 12, n elements of flip-flop circuits R1 to Rn are cascade-connected. The register 12 synchronizes with the inverted input signal Sin of optional frequency and shifts the $1/[2n+1]$ frequency-divided signal SQ successively.

The latch circuit 13 synchronizes with a non-inverted input signal Sin of optional frequency and holds the register output signal SR of the of the [n−1]th flip-flop circuit Rn−1 of the register 12.

The logic circuit 14 outputs logically an inverted latch output signal $\overline{XQ}$ outputted from the latch circuit 13 and a register output signal $\overline{SR}$ outputted from the flip-flop circuit Rn of the register 12. The logic circuit 14 is composed of a 2-input NAND circuit or a 2-input NOR circuit.

Figure 6:
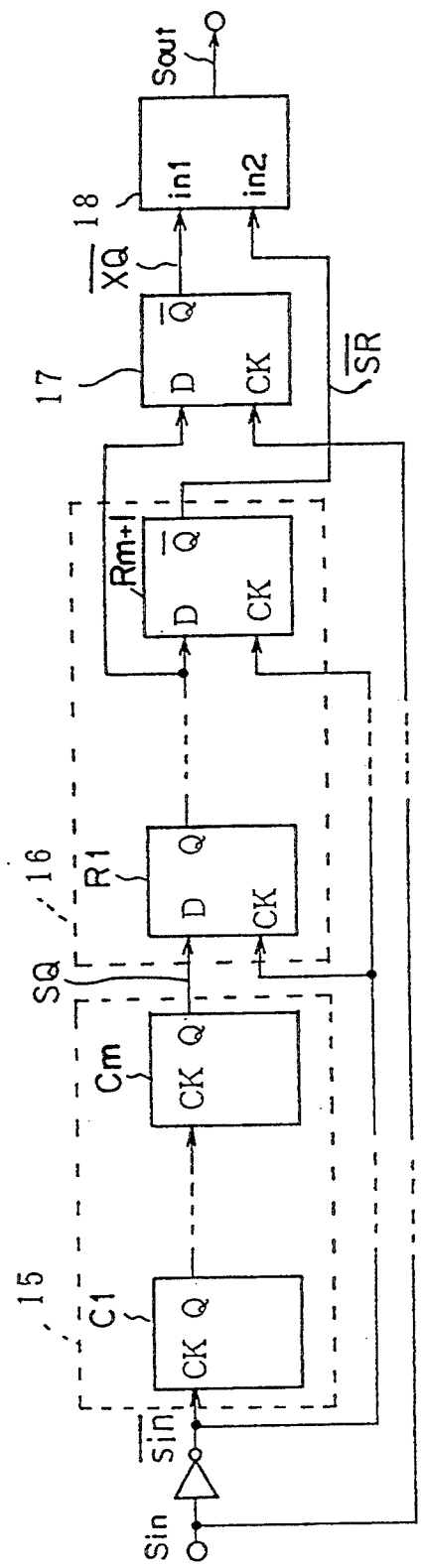
FIG. 6 is a structural diagram in principle of a second odd-number frequency divider according to the present invention.

Further, a second odd-number frequency divider in principle of the present invention has a counter 15, a register 16, a latch circuit 17 and a logic circuit 18 as shown in FIG. 6. In the counter 15, m (m is an integral number, m=m→3) pieces of flip-flop circuits C1 to Cm are cascade-connected. The counter 15 receives the inverted input signal Sin of optional frequency and outputs a 1/[2m+1] frequency-divided signal SQ.

In the register 16, m+1 pieces of flip-flop circuits R1 to R[m+1] are cascade-connected. The register 16 synchronizes with the inverted input signal Sin and shifts the 1/[2m+1] frequency-divided signal SQ successively.

The latch circuit 17 synchronizes with the non-inverted input signal Sin of optional frequency and holds the register output signal SR of the mth flip-flop circuit Rm for forming a register.

The logic circuit 18 outputs logically an inverted latch output signal $\overline{XQ}$ outputted from the latch circuit 17 and the register output signal $\overline{SR}$ of the [m+1]th flip-flop circuit R[m+1] of the register 16. The logic circuit 18 is composed of a 2-input NAND circuit or a 2-input NOR circuit. Besides, in the flip-flop circuits Cn and Cm for forming a counter, a data input terminal D is connected to an inverted output terminal $\overline{Q}$ as shown in FIG. 8(A). In the flip-flop circuits Rn and R[m+1] for forming a register, the inverted input signal Sin is supplied to a clock input terminal CK as shown in FIG. 5 and FIG. 6.

Furthermore, a third odd-number frequency divider in principle of the present invention has switching elements SW1 and SW2 as shown in FIG. 7. The switching element SW1 receives a program control signal S for forming a 1/[2n+1] frequency divider and connects among clock input terminals CK and data non-inverted output terminal Q of n elements of flip-flop circuits C1 to Cn for forming a counter, respectively.

The switching element SW2 connects among the data non-inverted output terminal Q and the data input terminals D of n elements of flip-flop circuits R1 to Rn for forming a register, respectively.

Further, in a method of constituting an odd-number frequency divider in principle of the present invention, n elements of flip-flop circuits C1 to Cn for forming a counter and n pieces of flip-flop circuits R1 to Rn for forming a register are arranged on the same chip. Here, in n elements of flip-flop circuits C1 to Cn for forming a counter, the data input terminals D are connected to the data inverted output terminals $\overline{Q}$, and the clock input terminals CK and the data non-inverted output terminals Q are opened in advance.

In n elements of flip-flop circuits R1 to Rn for forming a register, a data input terminal D, a clock input terminal CK, a data non-inverted output terminal Q and a data inverted output terminal $\overline{Q}$ are opened in advance.

The clock non-inverted output terminals Q of n pieces of flip-flop circuits C1 to Cn for forming a counter in such a state are connected to the clock input terminals CK in accordance with a design requirement, respectively.

Further, the data non-inverted output terminal Q of n pieces of flip-flop circuits R1 to Rn for forming a register are connected to the data input terminals D in accordance with a design requirement, and the clock input terminals CK of n pieces of flip-flop circuits R1 to Rn for forming a register are connected to a clock supply line LC in accordance with a design requirement.

Besides, the data non-inverted output terminal Q of the nth flip-flop circuit Cn for forming a counter is connected to the data input terminal D of the first flip-flop circuit R1 for forming a register in accordance with a design requirement.

Next, the operation of the first odd-number frequency divider of the present invention is described. For example, when the inverted input signal Sin of optional frequency f is inputted to the first flip-flop circuit C1 of the counter 11, a 1/[2n+1] frequency-divided signal SQ is outputted from the nth flip-flop circuit Cn to the first flip-flop circuit R1 of the register 12.

Further, the 1/[2n+1] frequency-divided signal SQ synchronizes with the inverted input signal Sin and is shifted successively by means of n elements of flip-flop circuits R1 to Rn of the register 12.

Here, the register output signal SR of the [n−1]th flip-flop circuit Rn−1 of the register 12 synchronizes with the non-inverted signal Sin and is held by the latch circuit 13. The inverted latch output signal $\overline{XQ}$ is outputted from the latch circuit 13 to the logic circuit 14, and the register output signal SR is outputted from the nth flip-flop circuit Rn of the register 12 to the logic circuit 14.

With this, when NAND logic for instance of the inverted latch output signal $\overline{XQ}$ and the register output signal $\overline{SR}$ is obtained by the logic circuit 14, it becomes possible to obtain a digital frequency-divided signal Sout having a frequency division ratio of 1/[2n+1] and a duty ratio of 50%.

Next, the operation of the second odd-number frequency divider in principle of the present invention will be described. For example, when the inverted input signal Sin of optional frequency is inputted to the first flip-flop circuit C1 of the counter 15, a 1/[2m+1] frequency-divided signal SQ is outputted from the mth flip-flop circuit Cm to the first flip-flop circuit R1 of the register 16.

Further, the 1/[2m+1] frequency-divided signal SQ synchronizes with the inverted input signal Sin and is shifted successively by m+1 pieces of flip-flop circuits R1 to R[2m+1] of the register 16.

Here, the register output signal SR of the mth flip-flop circuit Rm of the register 16 synchronizes with the non-inverted input signal Sin and is held by the latch circuit 17. The inverted latch output signal $\overline{XQ}$ is outputted from the latch circuit 17 to the logic circuit 18, and the register output signal SR is outputted from the mth flip-flop circuit Rm of the register 16 to the logic circuit 18.

With this, when NAND logic for instance of the inverted latch output signal $\overline{XQ}$ and the register output signal SR is obtained by the logic circuit 18, it becomes possible to obtain the digital frequency-divided signal Sout having the frequency division ratio of 1/[2m+1] and the duty ratio of 50%.

Next, the operation of the third odd-number frequency divider in principle of the present invention will be described. For example, when the program control signal S is supplied to the switching element SW1, it is possible to select the number of elements n of the flip-flop circuits Cn for forming the counter 11 automatically.

Further, the clock input terminals CK and the non-inverted output terminals Q of n elements of flip-flop circuits C1 to Cn are connected, respectively, by means of the switching element SW1. Thus, the counter 11 for outputting a $1/[2n+1]$ frequency-divided signal is constituted.

Furthermore, when the program control signal S is supplied to the switching element SW2, it is possible to select the number of elements n of the flip-flop circuit Rn constituting the register 12 automatically.

Further, the input terminals D and the data non-inverted output terminals Q of n elements of flip-flop circuits R1 to Rn are connected, respectively, by means of the switching element SW2. With this, the register 12 for shifting the $1/[2n+1]$ frequency-divided signal successively is constituted.

With this, it becomes possible to easily constitute an odd-number frequency divider for outputting the digital output signal Sout having a frequency division ratio of $\frac{1}{3}$, $\frac{1}{5}$ and $\frac{1}{7}$ and a duty ratio of 50% selectively.

Next, a method of constituting an odd-number frequency divider in principle of the present invention will be described. N elements of flip-flop circuits C1 to Cn for forming a counter and n pieces of flip-flop circuits R1 to Rn for forming a register arranged on the same chip in advance are connected respectively by a metal interconnection process or the like in accordance with a design requirement.

With this, it is possible to program optionally flip-flop circuits for forming a counter and flip-flop circuits for forming a register, and to constitute an odd-number frequency divider rich in variety for outputting a digital frequency-divided signal having a frequency division ratio of $1/[2n+1]$ and a duty ratio of 50%. As a result, it becomes possible to constitute a general use type frequency divider rich in flexibility and conformity.

Next, respective embodiments of the present invention will be described with reference to the drawings.

(1) Description of the First Preferred Embodiment

For example, a $\frac{1}{3}$ frequency divider which receives a clock signal Sin and outputs a digital frequency-divided signal Sout having a frequency division ratio of one-third is composed of an inverter IN1, a binary counter C11, a shift register 11, a latch circuit L1, a NAND circuits N1 and N2 and an inverter IN2.

Namely, the inverter IN1 inverts a non-inverted clock signal (hereinafter referred to simply as a clock signal) of optional frequency, and outputs an inverted clock signal Sin to the binary counter C11 and the shift register R11.

The binary counter C11 shows an example of n pieces of flip-flop circuits C1 to Cn, where n=1. The binary counter C11 receives an inverted clock signal Sin and outputs a $\frac{1}{3}$ frequency-divided signal (a non-inverted output signal) SQ to the shift register 11 and the latch circuit L1. Besides, the binary counter C11 is constituted by connecting the data input terminal D and the inverted output terminal $\overline{Q}$ of the flip-flop circuit each other. The non-inverted output terminal Q of the binary counter C11 is connected to a data input terminal D of the shift register R11 and a data input terminal D of the latch circuit L1.

The shift register R11 shows an example of n pieces of flip-flop circuits R1 to Rn, where n=1. The shift register R11 receives the inverted clock signal Sin, shifts the $\frac{1}{3}$ frequency-divided signal SQ and outputs the inverted register output signal $\overline{SR}$ to the NAND circuits N1 and N2. The clock input terminal CK of the shift register R11 is connected to the clock input terminal CK of the binary counter C11. The inverted output terminal $\overline{Q}$ of the shift register R11 is connected to an input terminal in2 of the NAND circuit N1.

The latch circuit L1 is composed of one element of flip-flop circuit, and receives the non-inverted clock signal Sin and latches the $\frac{1}{3}$ frequency-divided signal SQ. The inverted output terminal $\overline{Q}$ of the latch circuit L1 is connected to an input terminal in1 of the NAND circuit N1.

Further, the NAND circuit N1 shows an example of the logic circuit 12, and outputs NAND logic of a latch output signal XQ and an inverted register output signal SR. The NAND circuit N1 may be formed of a NOR circuit. The NAND circuit N2 and the inverter IN2 generate a clear signal SCL, which output the clear signal SCL to the binary counter C11, the shift register R11 and the latch circuit L1.

Next, the operation of a $\frac{1}{3}$ frequency divider will be described. For example, when a clock signal Sin of optional frequency such as shown in FIG. 10A is inputted to the $\frac{1}{3}$ frequency divider concerned, a $\frac{1}{3}$ frequency divided signal SQ (FIG. 10B) is outputted from the binary counter C11 to the shift register R11 (FIG. 10C) and the latch circuit L1 (FIG. 10D), and a digital frequency-divided signal Sout=S03 (FIG. 10E) having a frequency division ratio of $\frac{1}{3}$ and a duty ratio of 50% is outputted from the NAND circuit N1.

Namely, as shown in FIGS. 10A–10E, the latch output signal XQ falls synchronously with the rise (1) of the clock signal Sin. With this, the digital frequency-divided signal Sout rises. Thereafter, the inverted register output signal SR rises synchronously with the fall (2) of the clock signal Sin. With this, the digital frequency-divided signal Sout falls. Thereafter, the latch output signal XQ falls synchronously with the rise (3) of the clock signal Sin. With this, the digital frequency-divided signal Sout rises.

Next, the structure of a 1/5 frequency divider will be described. The 1/5 frequency divider which outputs a digital frequency-divided signal Sout having a frequency division ratio of one-fifth is composed of two pieces of binary counters C11 and C12, two pieces of shift registers R11 and R12, a latch circuit L1, NAND circuits N1 and N2 and inverters IN1 and IN2 as shown in FIG. 11.

Namely, the counters C11 and C12 show an example of n pieces of flip-flop circuits C1 to Cn, where n=2. The non-inverted output terminal Q of the counter C12 is connected to the data input terminal D of the shift register R11. The counter C11 receives an inverted clock signal Sin and outputs a non-inverted counter output signal (hereinafter referred to simply as a counter output signal) SQ1 to the counter C12. The counter C12 divides the frequency of the signal SQ1 and outputs a 1/5 frequency-divided signal SQ2 to the shift register R11.

The shift registers R11 and R12 show an example of n pieces of flip-flop circuits R1 to Rn, where n=2. The non-inverted output terminal Q of the shift register R11 is connected to the data input terminal D of the data input terminal D of the shift register R12 and the data input terminal D of the latch circuit L1. Further, the clock input terminal CK of the shift register R12 is connected to the clock input terminal CK of the counter C11. The inverted output terminal $\overline{Q}$ of the shift register R12 is connected to the input terminal in2 of the NAND circuit N1.

The shift register R11 shifts the 1/5 frequency-divided signal SQ2, and outputs the register output signal SR1 to the shift register R12 and the latch circuit L1. The shift register R12 shifts the signal SR1, and outputs an inverted register output signal SR2 to the logic circuit N1.

The inverted output terminal $\overline{Q}$ of the latch circuit L1 is connected to the input terminal in1 of the NAND circuit N1. The clock signal Sin is supplied to the clock input terminal CK of the latch circuit L1. Other structures and the method of connecting them are similar to those of the ½ odd-number frequency divider. Hence, the description thereof is omitted.

Now, the operation of the 1/5 frequency divider will be described. For example, when a clock signal Sin such as shown in FIG. 12 is inputted to the 1/5 frequency divider, the counter output signal SQ1 is outputted from the counter C11 to the counter C12, and the 1/5 frequency divided signal SQ2 is outputted from the binary counter C12 to the shift register R11. The 1/5 frequency-divided signal SQ2 is shifted by the shift register R11, and the register output signal SR1 is outputted to the shift register R12 and the latch circuit L1. With this, a digital frequency-divided signal Sout=S05 having a frequency division ratio of 1/5 and a duty ratio of 50% is outputted from the NAND circuit N1.

Namely, as shown in FIG. 12, the inverted register output signal SR2 rises synchronously with the fall (1) of the clock signal Sin. With this, the digital frequency-divided signal Sout falls. Thereafter, the latch output signal XQ falls synchronously with the rise (2) of the clock signal Sin. With this, the digital frequency-divided signal Sout rises. Thereafter, the inverted register output signal SR2 rises synchronously with the fall (3) of the clock signal Sin. With this, the digital frequency-divided signal Sout falls.

Figure 13:
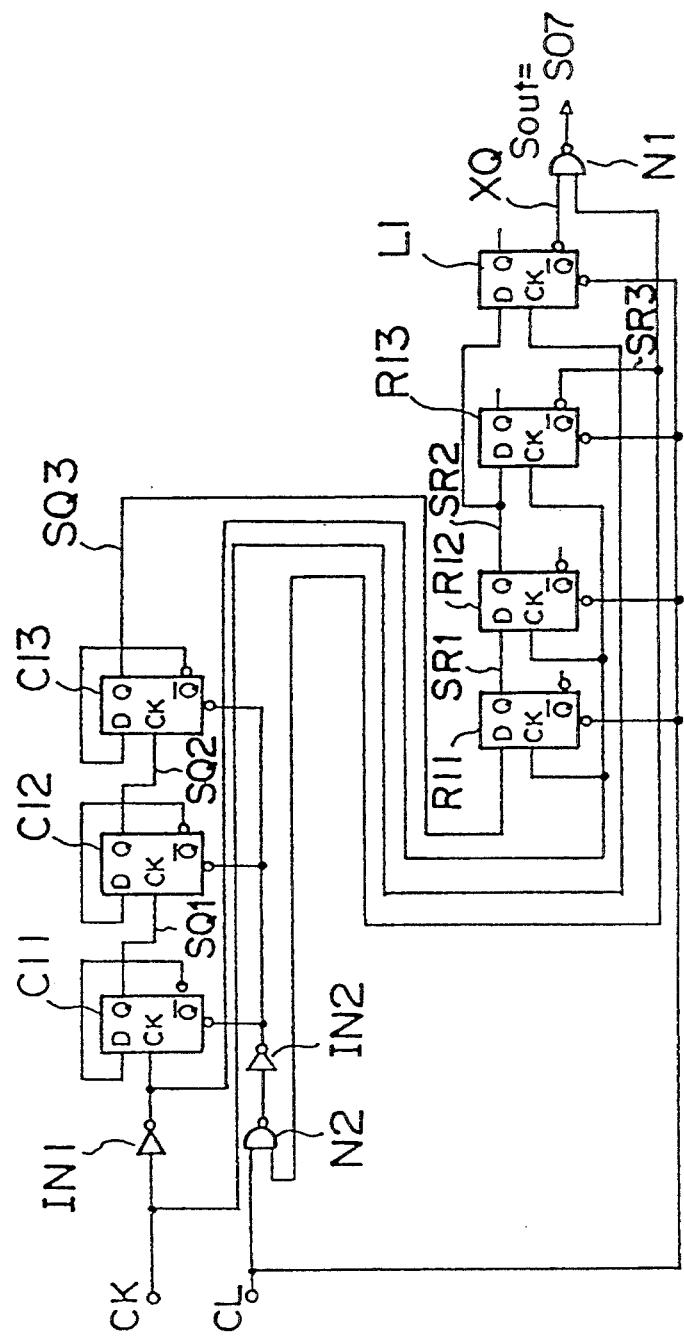
FIG. 13 is a structural diagram of a 1/7 frequency divider according to the first preferred embodiment of the present invention.

Next, a structure of a 1/7 frequency divider will be described. The 1/7 frequency divider which outputs a digital frequency-divided signal Sout having a frequency division ratio of one-seventh is composed of three pieces of binary counters C11, C12 and C13, three pieces of shift registers R11, R12 and R13, a latch circuit L1, NAND circuits N1 and N2 and inverters IN1 and IN2 as shown in FIG. 13.

Namely, the binary counters C11, C12 and C13 show an example of n pieces of flip-flop circuits C1 to Cn, where n=3. The non-inverted output terminal Q of the binary counter C13 is connected to the data input terminal D of the shift register R11. The counter C11 receives the inverted clock signal Sin and outputs the counter output signal SQ1 to the counter C12. The counter C12 divides the frequency of the signal SQ1, and outputs the counter output signal SQ2 to the counter C13. The counter C13 divides the frequency of the signal SQ2 and outputs a 1/7 frequency-divided signal SQ3 to the shift register R11.

The shift registers R11, R12 and R13 show an example of n pieces of shift register circuits R1 to Rn, where n=3. The non-inverted output terminal Q of the shift register R11 is connected to the data input terminal D of the shift register R12. The non-inverted output terminal Q of the shift register R12 is connected to the data input terminal D of the shift register R12 and the data input terminal D of the latch circuit L1, respectively.

The clock input terminal CK of the shift register R13 is connected to the clock input terminal CK of the counter C11, and the inverted output terminal $\overline{Q}$ of the shift register R13 is connected to the input terminal in2 of the NAND circuit N1.

The shift register R11 shifts the 1/7 frequency-divided signal SQ3, and outputs the register output signal SR1 to the shift register R12. The shift register R12 shifts the signal SR1 and outputs the register output signal SR2 to the shift register R13 and the latch circuit L1. The shift register R13 shifts the signal SR2 and outputs the inverted register output signal SR3 to the logic circuit N1.

Besides, the inverted output terminal Q is connected to the input terminal in1 of the NAND circuit N1 similarly to the ⅓ frequency divider and the 1/5 frequency divider. A clock signal Sin is supplied to the clock input terminal CK of the latch circuit L1. Other structures and the method of connection are similar to those in the ⅓ frequency divider and the 1/5 frequency divider according to the first embodiment. Hence, the description thereof is omitted.

Here, the operation of the 1/7 frequency divider will be described. For example, when a clock signal Sin such as shown in FIG. 14 is inputted to the 1/7 frequency divider, the counter output signal SQ1 is outputted from the counter C11 to the counter C12, the counter output signal SQ2 is outputted from the counter C12 to the counter C13, and the 1/7 frequency-divided signal SQ3 is outputted from the counter C13 to the shift register R11.

The signal SQ3 is shifted by the shift register R11, and the register output signal SR1 is outputted to the shift register R12. The signal SR1 is shifted by the shift register R12, and the register output signal SR2 is outputted to the shift register R13 and the latch circuit L1. With this, an output signal Sout=S07 having a frequency division ratio of 1/7 and a duty ratio of 50% is outputted from the NAND circuit N1.

Figure 14:
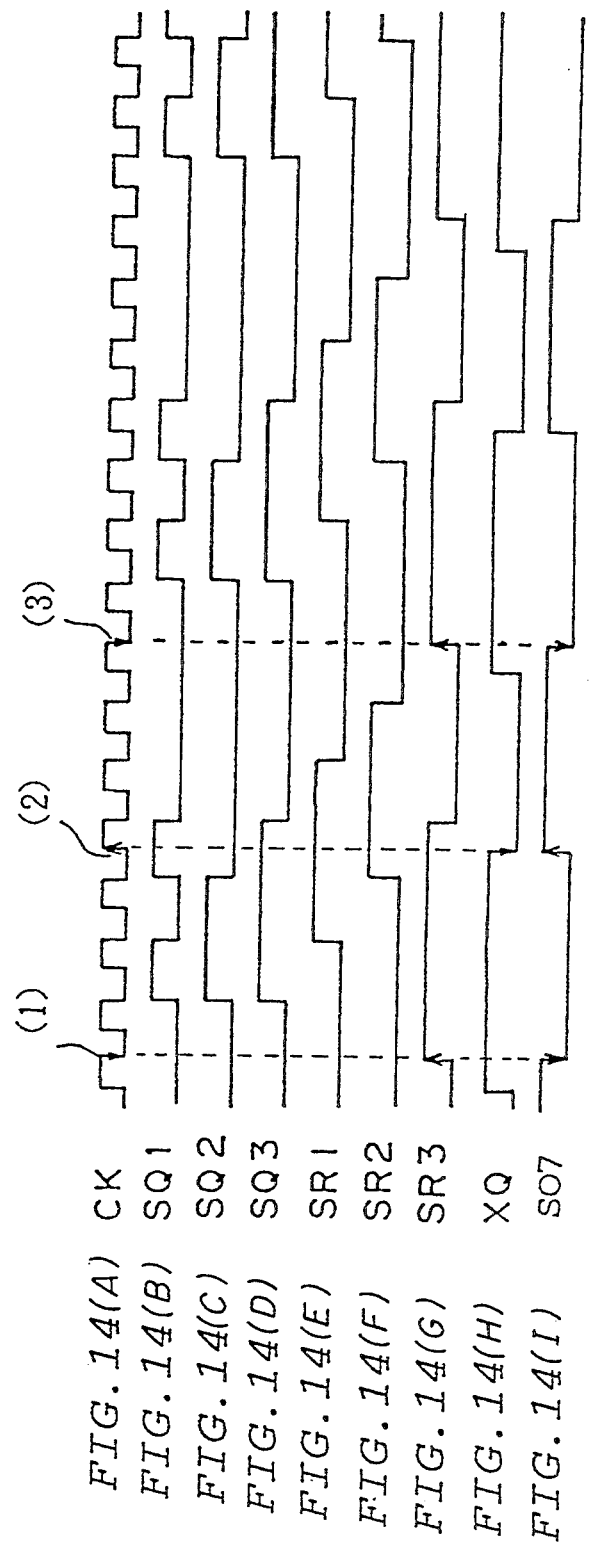
FIGS. 14A–14I are operational waveform diagrams of the 1/7 frequency divider according to the first embodiment of the present invention shown in FIG. 13.

Namely, an inverted register output signal SR3 rises synchronously with the fall (1) of the clock signal Sin as shown in FIG. 14. With this, the digital frequency-divided signal S07 falls. Thereafter, the latch output signal XQ falls synchronously with the rise (2) of the clock signal Sin. With this, the digital frequency divided signal S07 rises. Thereafter, the inverted register output signal SR3 rises synchronously with the fall (3) of the clock signal Sin. With this, the digital frequency-divided signal S07 falls.

Thus, according to the ⅓ frequency divider, the 1/5 frequency divider and the 1/7 frequency divider according to the first embodiment of the present invention, there are provided n[n=1, 2, 3] elements of binary counters C11 to C13, n[n=1, 2, 3] elements of shift registers R11 to R13, one piece of latch circuit L1 and NAND circuit N1 as shown in FIG. 9, FIG. 11 and FIG. 13, and the clock signal Sin is supplied to the clock input terminal CK of the latch circuit L1.

As a result, it becomes possible to output digital frequency-divided signal Sout=S03, S05, S07 having a duty ratio of 50% and frequency division ratios of ⅓, 1/5 and 1/7, respectively, as shown in FIG. 10, FIG. 12 and FIG. 14.

With this, when the duty ratio of 50% is required over the period of an "H" level or an "L" level of the digital control signal in the case of driving a gate circuit or a logic circuit, it becomes possible to cope with the matter sufficiently by the ⅓ frequency divider, the 1/5 frequency divider and the 1/7 frequency divider according to the first embodiment of the present invention. As a result, when an integrated circuit which operates by receiving a high speed clock signal is designed, it becomes possible to operate a latch circuit or a memory element incorporated therein with a digital frequency-divided signal having a frequency division ratio of ⅓, ⅕ and ⅐ and a duty ratio of 50%, thus stabilizing the operation.

(2) Description of the Second Preferred Embodiment

Being different from the first embodiment, the counter is composed of m[m is an integral number, m=3→m] elements of flip-flop circuits and the register is composed of m+1 elements of flip-flop circuits in a second preferred embodiment.

Figure 15:
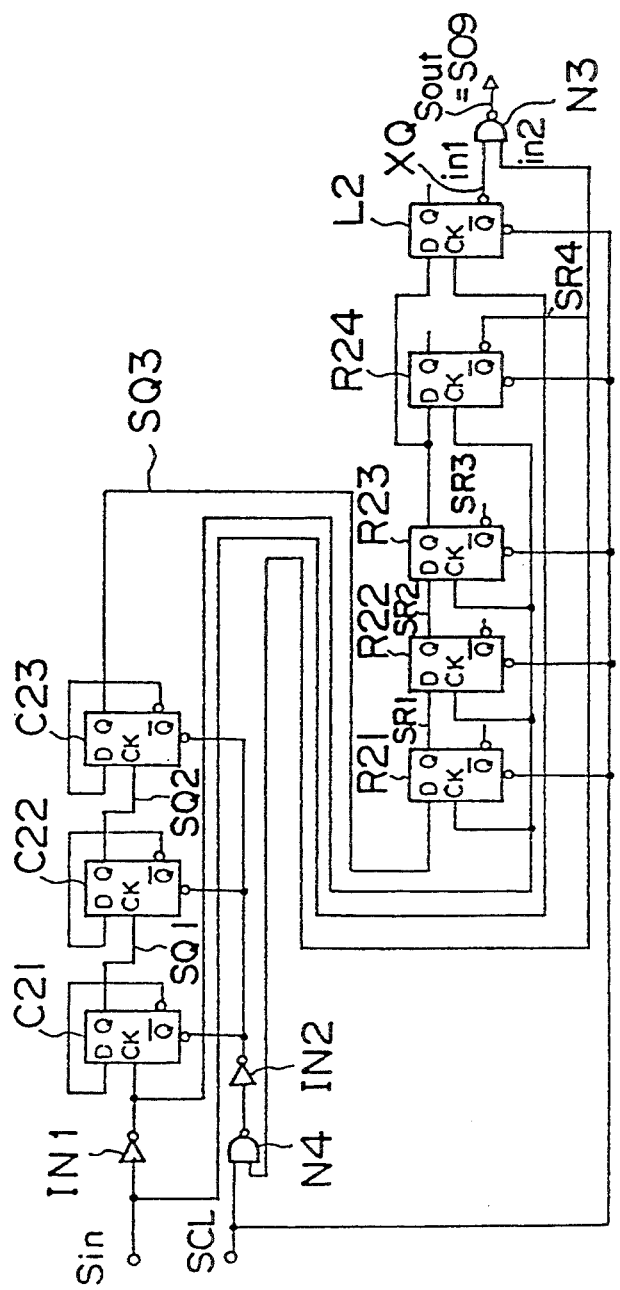
FIG. 15 is an explanatory diagram of a 1/9 frequency divider according to a second preferred embodiment of the present invention.

For example, a 1/9 frequency divider which receives a clock signal Sin and outputs a digital frequency-divided signal Sout having a frequency division ratio of one-ninth is composed of three elements of binary counters C21 to C23, four elements of shift registers R21 to R24, a latch circuit L2, NAND circuits N3 and N4 and inverters IN1 and IN2 as shown in FIG. 15.

Namely, the inverter IN1 inverts a non-inverted clock signal (hereinafter referred to simply as a clock signal) Sin of optional frequency, and outputs an inverted clock signal Sin to the binary counter C21 and the shift registers R21 to R24.

Three pieces of binary counters C21 to C23 show an example of m pieces of flip-flop circuits C1 to Cm, where m=3. In each flip-flop circuit, a data input terminal D is connected to an inverted output terminal $\overline{Q}$.

The counter C21 receives the inverted clock signal Sin and outputs a counter output signal SQ1 to the counter C22. The counter C22 divides the frequency of the signal SQ1 and outputs a counter output signal SQ2 to the counter C23. The counter C23 divides the frequency of the signal SQ2 and outputs a 1/9 frequency-divided signal SQ3 to the shift register R21.

The shift registers R21 to R24 show an example of m+1 pieces of flip-flop circuits R1 to R[m+1], where m=3. A non-inverted output terminal Q of the counter C23 is connected to a data input terminal D of the shift register R21. The non-inverted output terminal Q of the shift register R21 is connected to the data input terminal D of the shift register R22. The non-inverted output terminal Q of the shift register R22 is connected to the data input terminal D of the shift register R23. The non-inverted output terminal Q of the shift register R23 is connected to the data input terminal D of the shift register R24 and the data input terminal D of the latch circuit L2.

The clock input terminal CK of the shift register R24 is connected to the clock input terminal CK of the counter C21. An inverted output terminal $\overline{Q}$ of the shift register R24 is connected to the input terminal in2 of the NAND circuit N1.

The latch circuit is composed of one piece of flip-flop circuit. The inverted output terminal $\overline{Q}$ of the latch circuit L2 is connected to the input terminal in1 of the NAND circuit N3. The clock signal Sin is supplied to the clock input terminal CK of the latch circuit L2.

Further, the NAND circuit N3 shows an example of the logic circuit 18. The NAND circuit N3 may also be formed of a NOR circuit.

Here, the operation of the 1/9 frequency divider according to the second embodiment of the present invention will be described. For example, when a clock signal Sin such as shown in FIG. 16 is inputted to the 1/9 frequency divider, a counter output signal SQ1 is outputted from the counter C21 to the counter C22, a counter output signal SQ2 is outputted from the counter C22 to the counter 23, and a 1/9 frequency-divided signal SQ3 is outputted from the binary counter C23 to the shift register R21.

The signal SQ3 is shifted by the shift register R21, and the register output signal SR1 thereof is outputted to the shift register R22. The signal SR1 is shifted by the shift register R22, and the register output signal SR2 thereof is outputted to the shift register R23. The signal SR2 is shifted by the shift register R23, and an inverted register output signal SR3 thereof is outputted to the shift register R24 and the latch circuit L2. With this, an output signal Sout=S09 having a frequency division ratio of 1/9 and a duty ratio of 50% is outputted from the NAND circuit N3.

Figure 16:
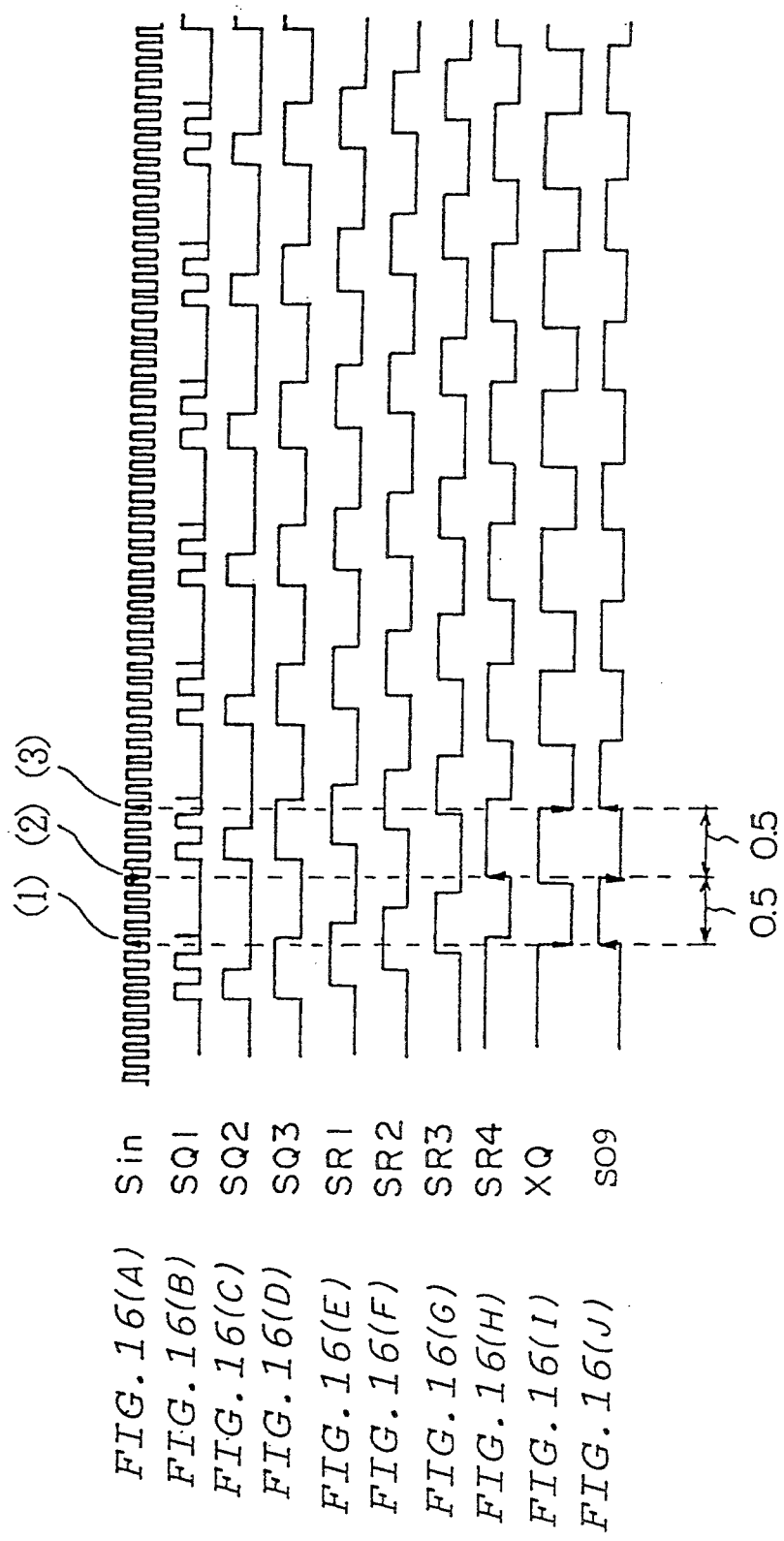
FIGS. 16A–16J is an operational waveform diagram of a 1/9 frequency divider according to the second embodiment of the present invention shown in FIG. 15.

Namely, a latch output signal XQ falls synchronously with the rise (1) of the clock signal Sin as shown in FIG. 16. With this, the digital frequency-divided signal S09 rises. Thereafter, an inverted register output signal SR4 rises synchronously with the fall (2) of the clock signal Sin. With this, the digital frequency-divided signal S09 falls. Thereafter, the latch output signal XQ falls synchronously with the rise (3) of the clock signal Sin. With this, the digital frequency-divided signal S09 rises.

Figure 17:
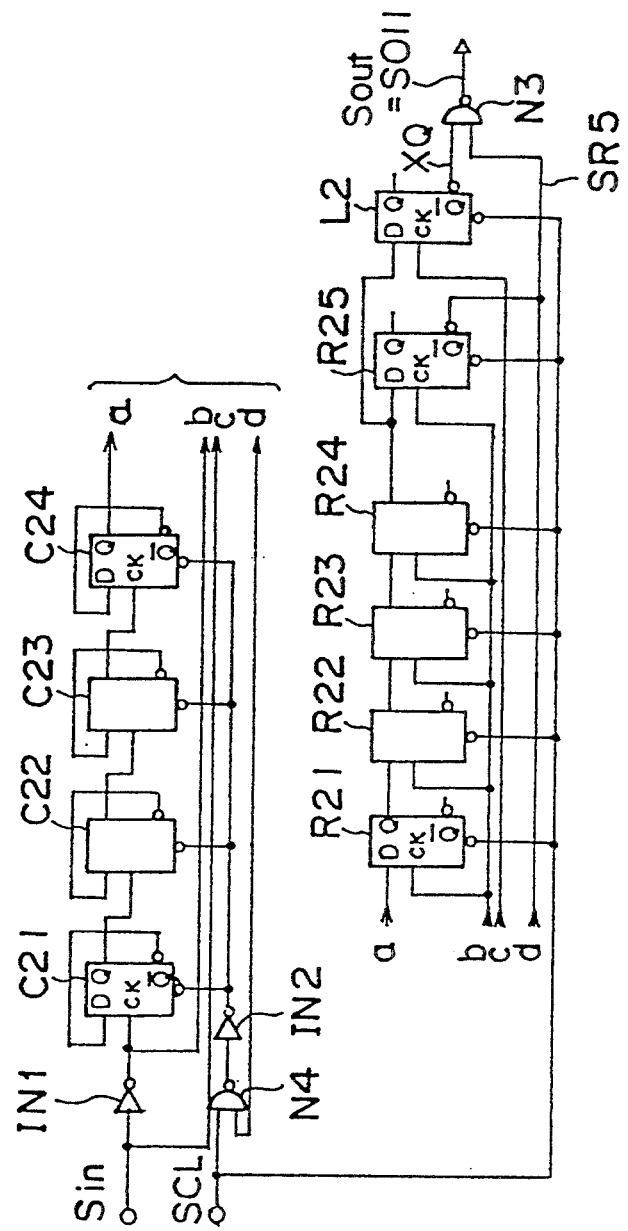
FIG. 17 is a structural diagram of a 1/11 frequency divider according to the second preferred embodiment of the present invention.

Next, the structure of a 1/11 frequency divider will be described. For example, the 1/11 frequency divider which receives the clock signal Sin and outputs a digital frequency-divided signal Sout having a frequency division ratio of one-eleventh is composed of four pieces of binary counters C21 to C24, five pieces of shift registers R21 to R25, a latch circuit L2, NAND circuits N3 and N4 and inverters IN1 and IN2 as shown in FIG. 17.

In the 1/11 frequency divider, four pieces of binary counters C21 to C24 are cascade-connected, and five pieces of shift registers R21 to R25 are cascade-connected. Other structures and the method of connection are similar to those in the 1/9 frequency divider. Hence, the description thereof is omitted.

Here, the operation of the 1/11 frequency divider will be described. For example, when a clock signal Sin such as shown in FIG. 22 is inputted to the frequency divider, a latch output signal XQ of the latch circuit L2 and an inverted register output signal SR5 of the register R25 are received, and an output signal Sout=S011 having a frequency division ratio of 1/11 and a duty ratio of 50% is outputted from the NAND circuit N3.

Figure 18:
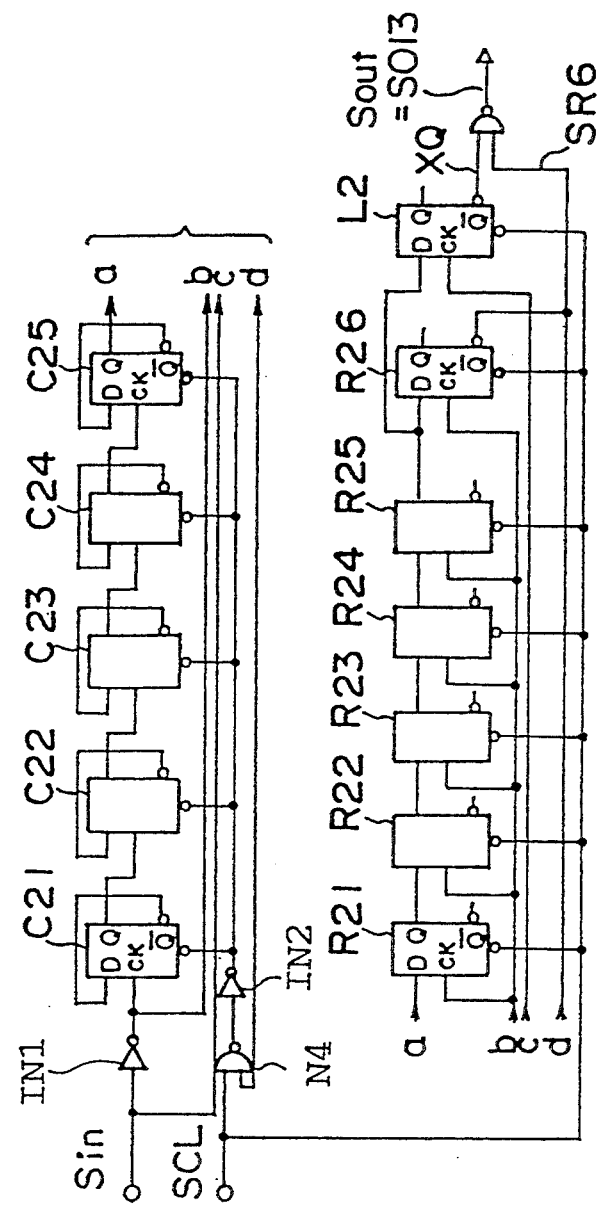
FIG. 18 is a structural diagram of a 1/13 frequency divider according to the second preferred embodiment of the present invention.

Next, a structure of a 1/13 frequency divider will be described. For example, a 1/13 frequency divider which receives the clock signal Sin and outputs a digital frequency-divided signal Sout is composed of five pieces of binary counters C21 to C25, six pieces of shift registers R21 to R26, a latch circuit L2. NAND circuits N3 and N4 and inverters IN1 and IN2 as shown in FIG. 18.

In the 1/13 frequency divider, five pieces of binary counters C21 to C25 are cascade-connected, and six pieces of shift registers R21 to R26 are cascade-connected. Other structures and method of connection are similar to those in the 1/9 frequency divider and 1/11 frequency divider. Hence, the description thereof is omitted.

Here, the operation of the 1/13 frequency divider will be described. For example, when a clock signal Sin such as shown in FIG. 22 is inputted to the 1/13 frequency divider, a latch output signal XQ of the latch circuit L2 and an inverted register output signal SR6 of the register R26 are received, and an output signal Sout=S013 having a frequency division ratio of 1/13 and a duty ratio of 50% is outputted from the NAND circuit N3.

Figure 19:
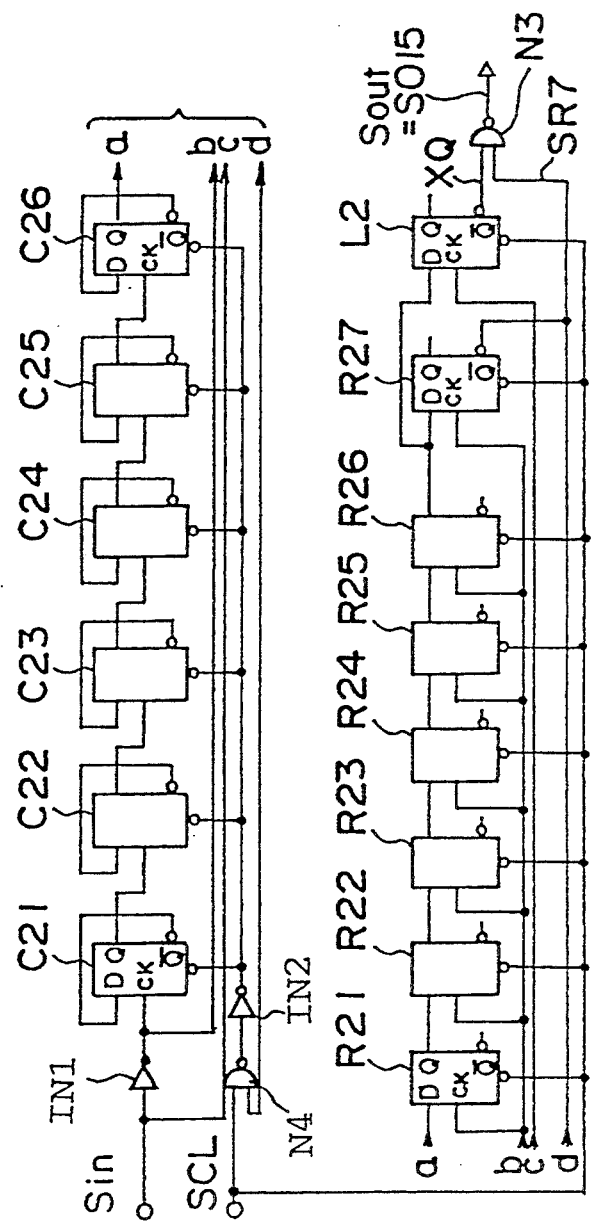
FIG. 19 is a structural diagram of a 1/15 frequency divider according to the second preferred embodiment of the present invention.

Next, a structure of a 1/15 frequency divider will be described. For example, a 1/15 frequency divider which receives the clock signal Sin and outputs the digital frequency-divided signal Sout having a frequency division ratio of one-fifteenth is composed of six pieces of binary counters C21 to C26, seven pieces of shift registers R21 to R27, a latch circuit L2, NAND circuits N3 and N4 and inverters IN1 and IN2 as shown in FIG. 19.

In the 1/15 frequency divider, six pieces of binary counters C21 to C26 are cascade-connected and seven pieces of shift registers R21 to R27 are cascade-connected. Other structures and method of connection are similar to those in the 1/9 frequency divider, the 1/11 frequency divider and the 1/13 frequency divider. Hence, the description thereof is omitted.

Here, the operation of the 1/15 frequency divider will be described. For example, when a clock signal Sin such as shown in FIG. 22 is inputted to the frequency divider, a latch output signal XQ of the latch circuit L2 and an inverted register output signal SR7 of the shift register R27 are received, and an output signal Sout=S015 having a frequency division ratio of 1/15 and a duty ratio of 50% is outputted from the NAND circuit N3.

Figure 20:
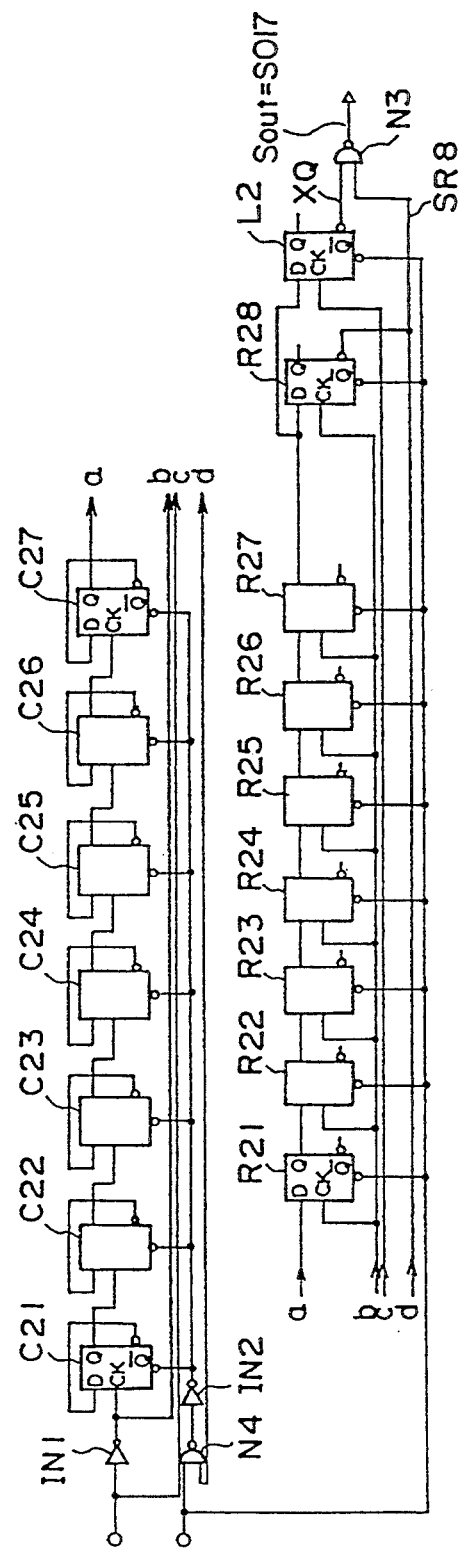
FIG. 20 is a structural diagram of a 1/17 frequency divider according to the second preferred embodiment of the present invention.

Next, a structure of a 1/17 frequency divider will be described. For example, a 1/17 frequency divider which receives the clock signal Sin and outputs a digital frequency-divided signal Sout having a frequency division ratio of one-seventeenth is composed of seven pieces of binary counters C21 to C27, eight pieces of shift registers R21 to R28, a latch circuit L2, NAND circuits N3 and N4 and inverters IN1 and IN2 as shown in FIG. 20.

In the 1/17 frequency divider, seven pieces of binary counters C21 to C27 are cascade-connected, and eight elements of shift registers R21 to R28 are cascade-connected. Other structures and method of connection are similar to those in the 1/9 frequency divider, the 1/11 frequency divider, the 1/13 frequency divider and the 1/15 frequency divider. Hence, the description thereof is omitted.

Here, the operation of the 1/17 frequency divider will be described. For example, when a clock signal Sin such as shown in FIG. 22 is inputted to the frequency divider, a latch output signal XQ of the latch circuit L2 and an inverted register output signal SR8 of the shift register R28 are received and an output signal Sout=S017 having a frequency division ratio of 1/17 and a duty ratio of 50% is outputted from the NAND circuit N3.

Figure 21:
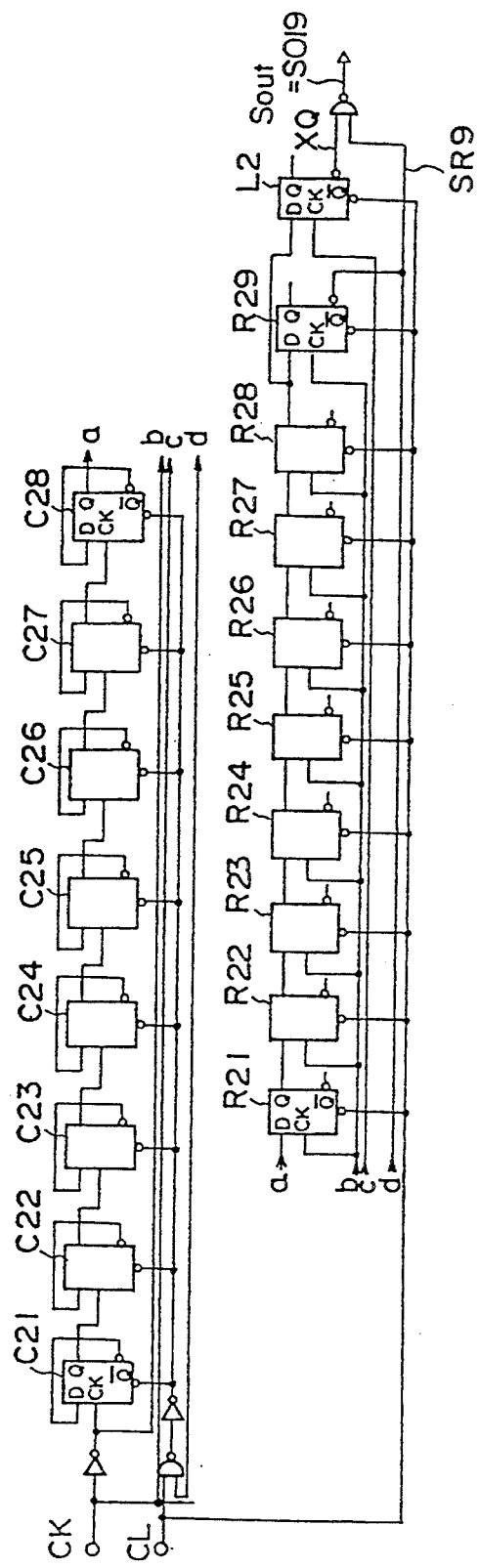
FIG. 21 is a structural diagram of a 1/19 frequency divider according to the second preferred embodiment of the present invention.

Next, a structure of a 1/19 frequency divider will be described. For example, a 1/19 frequency divider which receives the clock signal Sin and outputs a digital frequency-divided signal Sout having a frequency division ratio of one-nineteenth is composed of eight pieces of binary counters C21 to C28, nine elements of shift registers R21 to R29, a latch circuit L2, NAND circuits N3 and N4 and inverters IN1 and IN2 as shown in FIG. 21.

In the 1/19 frequency divider, eight pieces of binary counters C21 to C28 are cascade-connected and nine elements of shift registers R21 and R29 are cascade-connected. Other structures and method of connection are similar to those in the 1/9 frequency divider, the 1/11 frequency divider, the 1/13 frequency divider, the 1/15 frequency divider and the 1/17 frequency divider. Hence, the description thereof is omitted.

Here, the operation of the 1/19 frequency divider will be described. For example, when a clock signal Sin such as shown in FIG. 22 is inputted to the frequency divider, a latch output signal XQ of the latch circuit L2 and an inverted register output signal SR9 of the shift register R29 are received and an output signal Sout=S019 having a frequency division ratio of 1/19 and a duty ratio of 50% is outputted from the NAND circuit N3.

Thus, according to the 1/9 frequency divider, the 1/11 frequency divider, the 1/13 frequency divider, the 1/15 frequency divider, the 1/17 frequency divider and the 1/19 frequency divider according to the second embodiment of the present invention, there are provided m[m=3 to 8] elements of binary counters C21 to C28, m+1[m=3 to 8] elements of shift registers R21 to R29, one element of latch circuit L1 and NAND circuit N1 as shown in FIG. 17 to FIG. 21. The clock signal Sin is supplied to the clock input terminal CK of the latch circuit L1.

As a result, it becomes possible to output digital frequency-divided signals Sout=S09, S011, S013, S015, S017 or S019 having a duty ratio of 50% and a frequency division ratio of 1/9, 1/11, 1/13, 1/15, 1/17 or 1/19, respectively, as shown in FIG. 22.

With this, when a duty ratio of 50% is required over a period of an "H" level or an "L" level of the digital control signal in the case of designing a gate circuit or a logic circuit similarly to respective odd-number frequency dividers according to the first embodiment of the present invention, it becomes possible to cope with sufficiently by means of the 1/9 frequency divider, the 1/11 frequency divider, the 1/13 frequency divider, the 1/15 frequency divider, the 1/17 frequency divider and the 1/19 frequency divider.

As a result, when an integrated circuit which is operated by receiving a high speed clock signal is designed, it becomes possible to operate a latch circuit and a memory element incorporated therein by a digital frequency-divided signal having a frequency division ratio of 1/9, 1/11, 1/13, 1/15, 1/17 or 1/19 and a duty ratio of 50%, thus aiming at stabilization of the operation.

(3) Description of the Third Preferred Embodiment

Being different from the first embodiment and the second embodiment, switching elements SW1 and SW2 for selecting a frequency division ratio automatically are provided in a third preferred embodiment. The switching elements SW1 and SW2 are controlled by a program control signal S.

Figure 23:
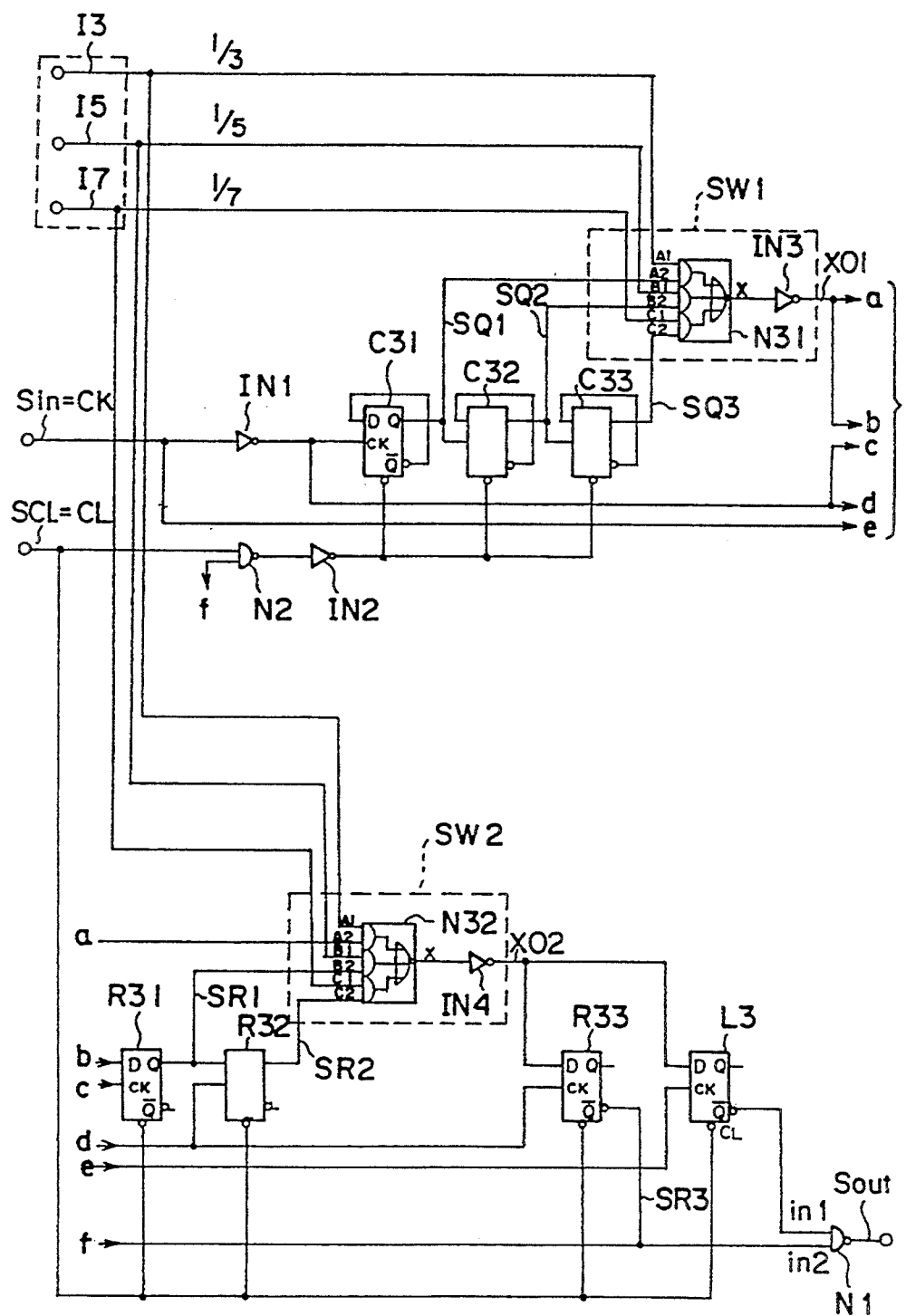
FIG. 23 is a structural diagram of a programmable odd-number frequency divider (selection system) according to a third preferred embodiment of the present invention.

For example, a programmable odd-number frequency divider which receives circuit selective signals I3, I5 or I7 which becomes an example of the program control signal S and outputs a digital frequency-divided signal Sout having a frequency division ratio of ⅓, 1/5 or 1/7 selectively is composed of three elements of binary counters C31 to C33, three elements of shift registers R31 to R33, a latch circuit L3, switch circuits SW1 and SW2, NAND circuits N1 and N2 and inverters IN1 and IN2 as shown in FIG. 23.

Namely, the switch circuit SW1 is composed of a 6-input AND-OR inverter circuit N31 and an inverter IN3. Input terminals A1, B1 and C1 of the inverter circuit N31 are connected to supply portions of the circuit selective signals I3, I5, and I7. Another input terminal A2 is connected to non-inverted output terminals Q of the binary counters C31 and C32. This non-inverted output terminal Q is connected to the clock input terminal CK.

An input terminal B2 of the inverter circuit N31 is connected to non-inverted output terminals Q of the binary counters C32 and C33. This non-inverted output terminal Q is connected to the clock input terminal CK. Further, the input terminal C2 of the inverter circuit N31 is connected to the non-inverted output terminal Q of the binary counter C33. An output terminal x of the inverter circuit N31 is connected to the input terminal A2 of the switch circuit SW2 through the inverter IN3. This input terminal A2 is connected to a data input terminal D of the register R31.

Furthermore, the switch circuit SW2 is composed of a 6-input AND-OR inverter circuit N32 and an inverter IN4. Input terminals A1, B1 and C1 of the inverter circuit N32 are connected to the supply portion of the circuit selective signals I3, I5, and I7. Another input terminal B2 is connected to non-inverted output terminals Q of the registers R31 and R32. This non-inverted output terminal Q is connected to the data input terminal D. An input terminal C2 of the inverter circuit N32 is connected to the non-inverted output terminal Q of the shift register R32. Further, an output terminal x of the inverter circuit N32 is connected to a data input terminal D of the shift register R33 through the inverter IN4. This data input terminal D is connected to the data input terminal D of the latch circuit L3.

Besides, in the latch circuit L3, the inverted output terminal $\overline{Q}$ thereof is connected to the input terminal in1 of the NAND circuit N1 and the clock signal Sin is supplied to the clock input terminal CK thereof similarly to the first embodiment. Other structures and method of connection are similar to those in the first embodiment. Hence, the description thereof is omitted.

Figure 24C:
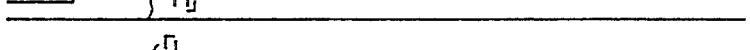
Figure 24D:
Figure 24E:
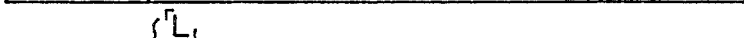

Next, the operation of a programmable odd-number frequency divider will be described. For example, when circuit selective signal I3="H" (high) level and I5=I7="L" (low) level are supplied to the switch circuits SW1 and SW2 as shown in an operational time chart at time of programming in FIG. 24, a logic output signal X01 is outputted to the data input terminal D of the shift register R31 and the switch circuit SW2.

Here, the logic output signal X01 is an inverted output signal of the 6-input AND-OR inverter circuit N31, and is an inverted signal produced by obtaining 6-input AND-OR logic of a logic signal SQ1, a logic signal SQ2, a logic signal SQ3, a signal I3="H" level and I5=I7="L" level. Besides, the logic signal SQ1 is an output at the non-inverted output terminal Q of the binary counter C31, the logic signal SQ2 is an output at the non-inverted output terminal Q of the binary counter C32, and the logic signal SQ3 is an output at the non-inverted output terminal Q of the binary counter C33.

Further, when the logic output signal X01 is inputted to the 6-input AND-OR inverter circuit N32, a logic output signal X02 is outputted to data input terminals D of the latch circuit L3 and the third shift register R33.

Here, the logic output signal X02 is an inverted output signal of the 6-input AND-OR inverter circuit N32, and is an inverted signal by 6-input AND-OR logic of a logic signal SR1, a logic signal SR2, a signal I3="H" level and I5=I7="L" level. Besides, the logic signal SR1 is the output at the non-inverted output terminal Q of the shift register R31, and the logic signal SR2 is the output of the non-inverted output terminal Q of the shift register R32.

With this, a digital frequency-divided signal Sout=S03 having a frequency division ratio of ⅓ and a duty ratio of 50% is outputted selectively from the NAND circuit N1.

Figure 25C:
Figure 25D:
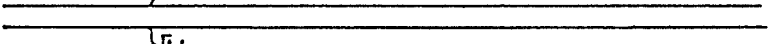
Figure 25E:

Further, as shown in the operational time chart at time of programming in FIG. 25, when circuit selective signals I5="H" level and I3=I7="L" level are supplied to the switch circuits SW1 and SW2, an output signal Sout=S05 having a frequency division ratio of 1/5 and a duty ratio of 50% is outputted selectively from the NAND circuit N1.

Figure 26C:
Figure 26D:
Figure 26E:
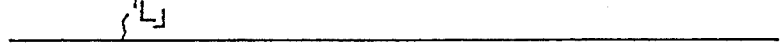

Furthermore, as shown in an operational time chart at time of programming in FIG. 26, when circuit selective signals I7="H" level and I3=I5="L" level are supplied to the switch circuits SW1 and SW2, an output signal Sout=S07 having a frequency division ratio of 1/7 and a duty ratio of 50% is outputted selectively from the NAND circuit N1.

Thus, according to a programmable odd-number frequency divider according to the third embodiment of the present invention, the switch circuits SW1 and SW2 are connected among three elements of binary counters C31 to C33 and among three elements of shift registers R31 to R33, respectively, as shown in FIG. 23.

As a result, when circuit selective signals I3, I5 and I7 are supplied to the switch circuits SW1 and SW2, it is possible to select the effective number of elements as one element, two elements or three pieces, respectively, among three elements of binary counters C1 to C3 and three elements of shift registers R1 to R3.

With this, it becomes possible to selectively output the output signals Sout=S03, S05 or S07 having a frequency division ratios of ⅓, ⅕ and 1/7 and a duty ratio of 50%.

When it is desired to obtain a frequency division ratio of 1/9, 1/11 and so on, m[m=3 to m] elements of binary counters C1 to Cm and [m+1] elements of shift registers R1 to Rm+1 suitable therefor are arranged and switching elements are connected among them.

Further, the switching element may also be formed by a field effect transistor (MOSFET). It is sufficient that a switch equivalent circuit shown in FIG. 7 is realized. In such a case, circuit selective signals I3, I5 and I7 are inputted to the gate of the field effect transistor so as to control the gate of the transistor. With this, it is possible to bring between the counters C1 and C3 and between the shift registers R1 to R3 into a short-circuited or disconnected state. As a result, it becomes possible to constitute a general use type frequency divider.

(4) Description of the Fourth Preferred Embodiment

Being different from the third embodiment, basic cells of n elements of binary counters C1 to Cn, n pieces of shift registers R1 to Rn and so on are arranged in advance on a chip, and the input terminals and the output terminals thereof are interconnected optionally in accordance with a design requirement.

Figure 27:
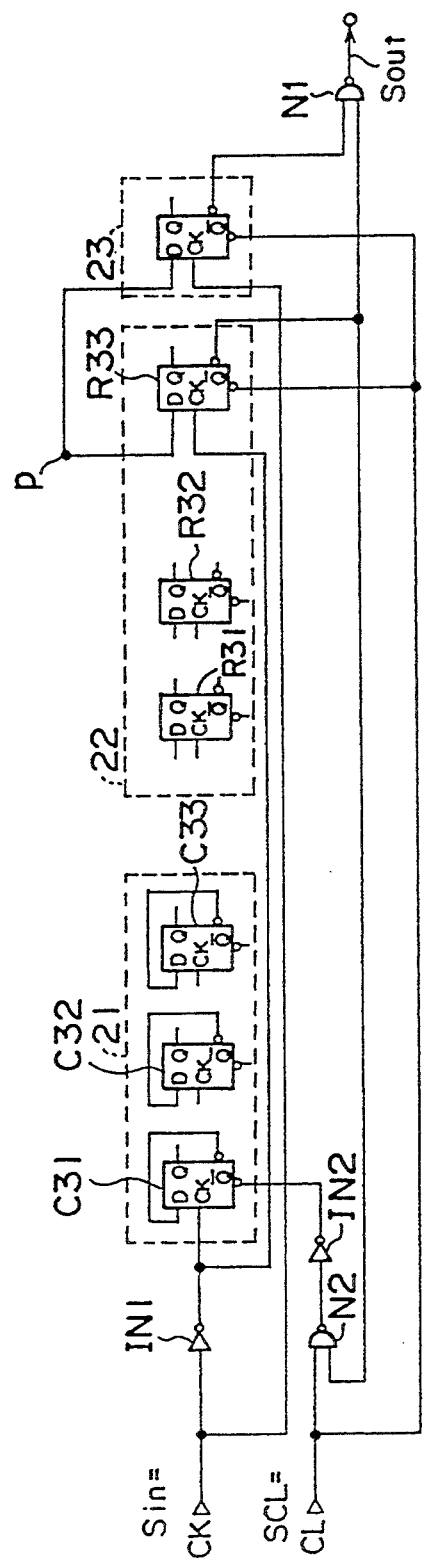
FIG. 27 is a structural diagram of a programmable odd-number frequency divider (an interconnection system) according to the fourth preferred embodiment of the present invention.

For example, in a programmable odd-number frequency divder capable of constituting ⅓, ⅕ and 1/7 frequency dividers, a cell 21 for forming a counter and a cell 22 for forming a shift register are arranged on a semiconductor chip in advance as shown in FIG. 27. Three pieces of binary counters C31 to C33 are allotted to the cell 21 for forming a counter. The non-inverted output terminals Q and the clock input terminals CK in the cell 21 are kept disconnected.

Three elements of shift registers R31 to R33 are allotted to the cell 22 for forming a shift register. The non-inverted output terminals Q and the data input terminals D in the cell 22 are kept disconnected. Besides, those circuit portions common to ⅓, ⅕ and ⅐ frequency dividers are interconnected in advance. For example, the data input terminals D of respective flip-flop circuits in the cell 21 are connected to the inverted output terminals Q in advance.

Further, the data input terminal D of the shift register R33 is connected to the data input terminal D of the latch circuit L3. This junction becomes a program point P in interconnection processes for instance.

Next, a case when a ⅓ frequency divider is formed will be described. For example, a non-inverted output terminal Q of the binary counter C31 is interconnected to the program point P in accordance with a design requirement. These interconnection processes are performed by using aluminum AL1(Al line). With this, one each of flip-flop circuits constituting the binary counter C31 and the shift register R33 is selected among three pieces of binary counters C31 to C33 and three elements of shift registers R31 to R33. Thus, a ⅓ frequency divider for outputting an output signal Sout=S03 having a frequency division ratio of ⅓ and a duty ratio of 50% is constituted.

Figure 29:
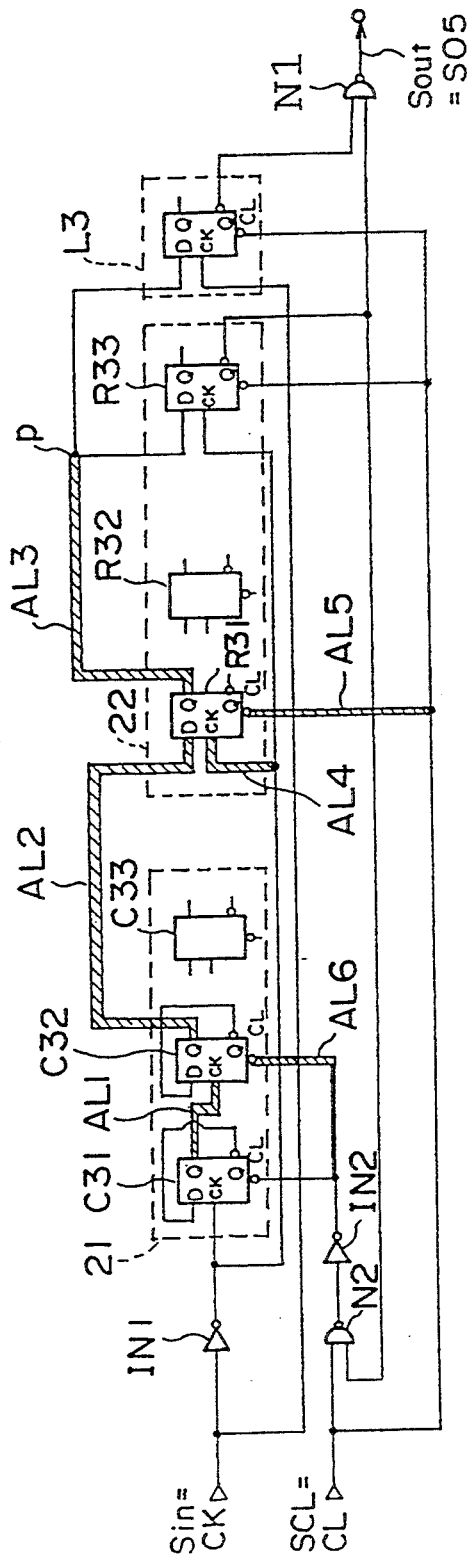
FIG. 29 is an interconnection state diagram of a 1/5 frequency divider at time of programming according to the fourth preferred embodiment of the present invention.

Next, a case of constituting a 1/5 frequency divider will be described. For example, as shown in FIG. 29, the non-inverted output terminal Q of the binary counter C31 is interconnected to the clock input terminal CK of the counter C32. In the interconnection processes, aluminum AL1 is used similarly to the ⅓ frequency divider.

The non-inverted output terminal Q of the counter C32 is connected to the data input terminal D of the shift register R34. In the interconnection processes, aluminum AL2 is used for instance. The non-inverted output terminal Q of the shift register R34 is interconnected to a program point P. In the interconnection processes, aluminum AL3 is used for instance.

With this, flip-flop circuits for constituting binary counters C31 and C32 and shift registers R31 and R33 are selected among three elements of binary counters C31 to C33 and three elements of shift registers R31 to R33. Besides, the clock input terminal CK of the shift register R31 is interconnected to the clock input terminal CK of the binary counter C31 by aluminum AL4.

A clear input terminal CL of the shift register R31 is interconnected to the clear input terminal CL of the latch circuit L3 by aluminum AL5. The clear input terminal CL of the binary counter C32 is interconnected to the clear input terminal CL of the binary counter C31 through aluminum AL6.

With this, a 1/5 frequency divider for outputting an output signal Sout:S05 having a frequency division ratio of 1/5 and a duty ratio of 50% selectively is constituted.

Figure 30:
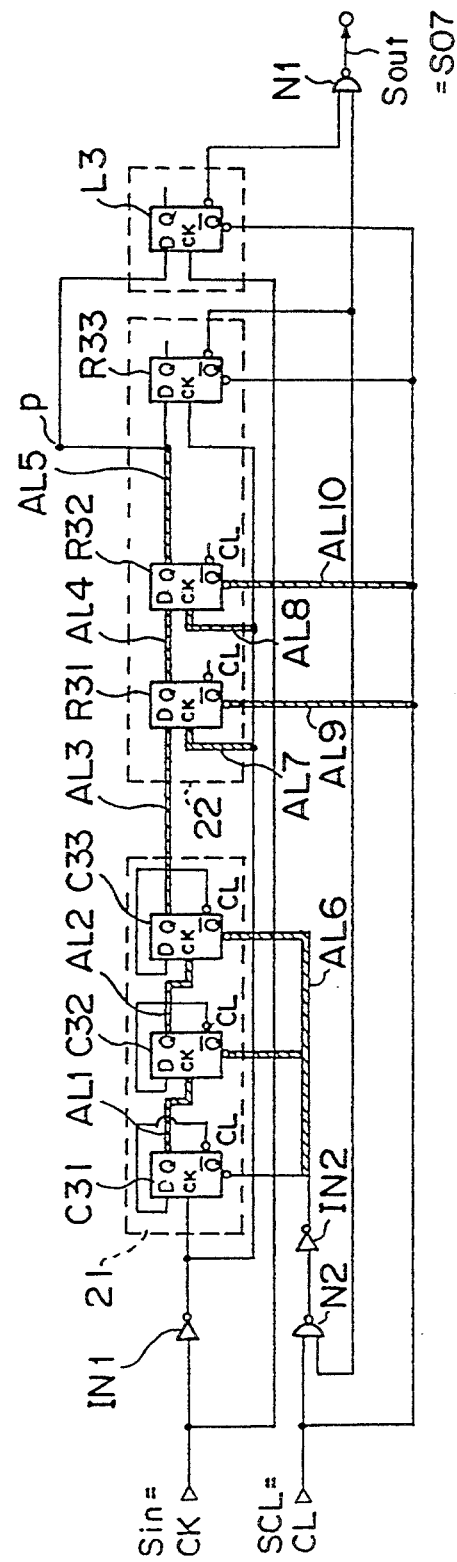
FIG. 30 is an interconnection state diagram of a 1/7 frequency divider at time of programming according to the fourth preferred embodiment of the present invention.

Next, a case of constituting a 1/7 frequency divider will be described. For example, as shown in FIG. 30, the non-inverted output terminal Q of the binary counter C31 is interconnected to the clock input terminal CK of the counter C32 in accordance with a design requirement. In the interconnection processes, aluminum AL1 is used similarly to the ⅓ frequency divider and the 1/5 frequency divider.

The non-inverted output terminal Q of the counter C32 is interconnected to the clock input terminal CK of the counter C33. In the interconnection processes, aluminum AL2 is used. The non-inverted output terminal Q of the counter C33 is interconnected to the data input terminal D of the shift register R34. In the interconnection processes, aluminum AL3 is used for instance. The non-inverted output terminal Q of the shift register R34 is interconnected to the data input terminal D of the shift register R32. In the interconnection processes, aluminum AL4 is used for instance. The non-inverted output terminal Q of the shift register R32 is interconnected to the program point P. In the interconnection processes, aluminum AL5 is used for instance.

With this, all of the flip-flop circuits constituting three elements of binary counters C31 to C33 and three pieces of shift registers R31 to R33 are selected.

Besides, the clear input terminals CL of the binary counters C32 and C33 are interconnected to the clear input terminal CL of the binary counter C31 by aluminum AL6. The clock input terminal CK of the shift register R31 is interconnected to the clock input terminal CK of the binary counter C31 by aluminum AL7.

The clock input terminal CK of the shift register R32 is interconnected to the clock input terminal CK of the binary counter C31 by aluminum AL8. Further, the clear input terminal CL of the shift register R31 is interconnected to the clear input terminal CL of the latch circuit L3 by aluminum AL9. The clear input terminal CL of the shift register R32 is interconnected to the clear input terminal CL of the latch circuit L3 by aluminum AL10.

With this, a 1/7 frequency divider for outputting an output signal Sout=S07 having a frequency division ratio of 1/7 and a duty ratio of 50% selectively is constituted.

Thus, according to a method of constituting an odd-number frequency divider according to the fourth embodiment of the present invention, a cell 21 composed of three pieces of binary counters C31, C32 and C33 and a cell 22 composed of three elements of shift registers R31, R32 and R33 with common portions only connected one another as shown in FIG. 27 are arranged on a semiconductor chip. These counters C31 to C33 and shift registers R31 to R33 are connected one another optionally by means of an interconnection program.

Figure 28:
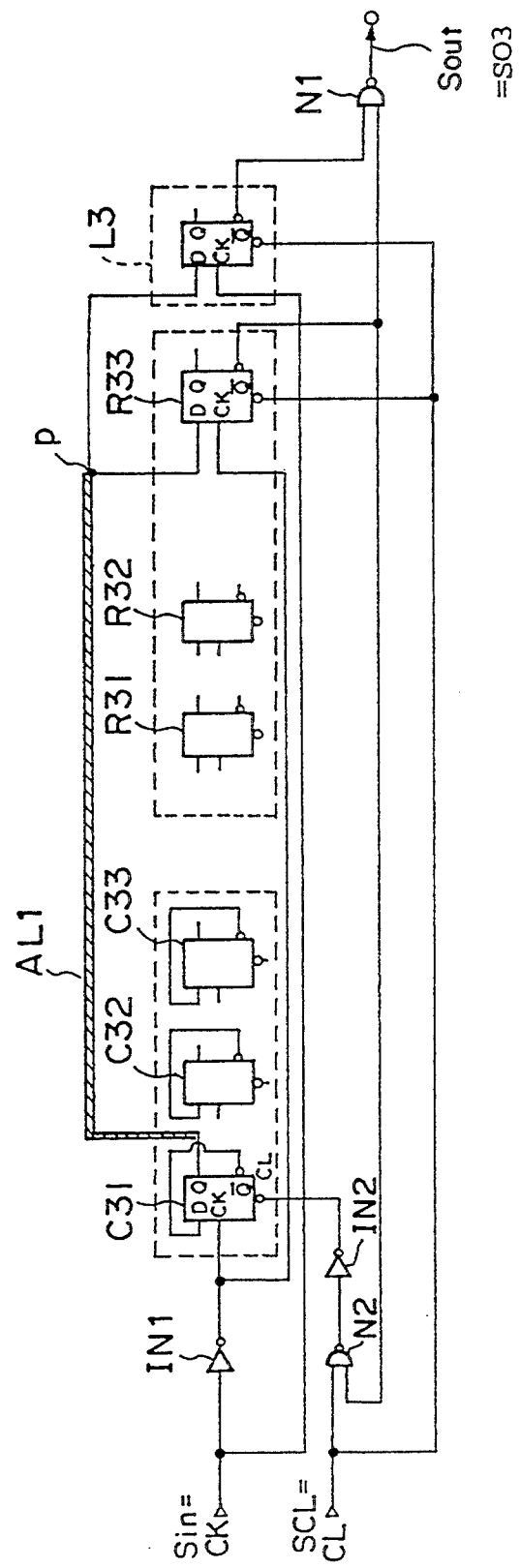
FIG. 28 is an interconnection state diagram of a ⅓ frequency divider at time of programming according to the fourth preferred embodiment of the present invention.

As a result, when one piece of binary counter C31 and one piece of shift register R31 are interconnected as shown in FIG. 28, it becomes possible to easily constitute a ⅓ frequency divider for outputting selectively an output signal Sout=S03 having a frequency division ratio of ⅓ and a duty ratio of 50%.

Further, when two pieces of binary counters C31 and C32 and two pieces of shift registers R31 and R33 are connected as shown in FIG. 29, it becomes possible to easily constitute a 1/5 frequency divider for outputting selectively an output signal Sout=S05 having a frequency division ratio of 1/5 and a duty ratio of 50%.

Furthermore, when three elements of binary counters C31 to C33 and three elements of shift registers R31 to R33 are interconnected as shown in FIG. 30, it becomes possible to easily constitute a 1/7 frequency divider for outputting selectively an output signal Sout=S07 having a frequency division ratio of 1/7 and a duty ratio of 50%.

With this, it becomes possible to constitute a general use type odd-number frequency divider rich in flexibility and conformity for a design requirement.

(5) Description of the Fifth Preferred Embodiment

Being different from the first embodiment to the fourth embodiment, an optional counter is provided at the front stage of an odd-number frequency divider in a fifth preferred embodiment.

Figure 31:
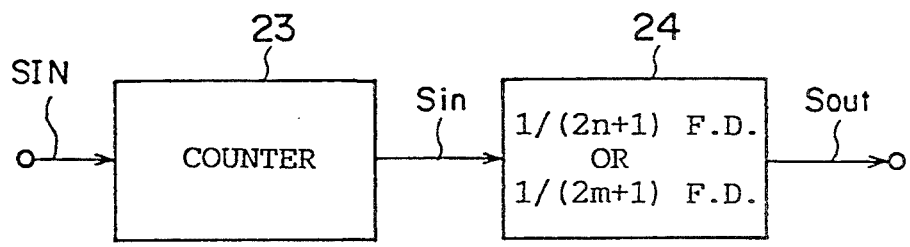
FIG. 31 is a structural diagram of an odd-number frequency divider according to a fifth preferred embodiment of the present invention.

For example, an optional counter 23 is connected at a front stage of an odd-number frequency divider 24 as shown in FIG. 31. The odd-number frequency divider 24 is a 1/[2n+1] frequency divider according to the first embodiment of the present invention or a 1/[2m+1] frequency divider according to the second embodiment. The counter 23 outputs a clock signal Sin obtained by dividing a high speed clock signal SIN to the clock input terminal CK of the odd-number frequency divider 24.

The operation of the odd-number frequency divider concerned will be described. For example, when the high speed clock signal SIN is inputted to the counter 23, this signal SIN is frequency-divided at an optional frequency division ratio, and the clock signal Sin thereof is outputted to the odd-number frequency divider 24. Upon receipt of the signal Sin, a digital frequency-divided signal Sout having a frequency division ratio of 1/[2n+1] or 1/[2m+1] and a duty ratio of 50% is outputted from the frequency divider 24.

In Such a manner, according to an odd-number frequency divider according to the fifth embodiment of the present invention, the counter 23 having an optional frequency division ratio is connected at the front stage or a 1/[2n+1] frequency divider according to the first embodiment of the present invention or a 1/[2m+1] frequency divider according to the second embodiment as shown in FIG. 31.

As a result, the high speed clock signal SIN is frequency-divided in advance at an optional frequency division ratio by means of the optional counter 23, and the clock signal Sin is outputted to the frequency divider 24.

With this, when an integrated circuit which receives the high speed clock signal SIN and operates is designed, it becomes possible to operate a circuit element by a digital frequency-divided signal Sin having an optional duty ratio. This fact contributes greatly to high performance and high function of a data processing unit.

(6) Description of the Sixth Preferred Embodiment

Being different from the fifth embodiment, an optional counter is provided at the final stage of an odd-number frequency divider in a sixth preferred embodiment.

Figure 32:
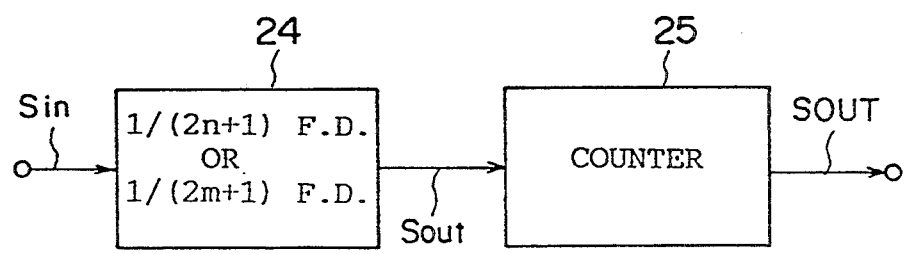
FIG. 32 is a structural diagram of an odd-number frequency divider according to a sixth preferred embodiment of the present invention.

For example, an optional counter 25 is connected to the final stage of the odd-number frequency divider 24 as shown in FIG. 32. Here, the odd-number frequency divider 24 is the 1/[2n+1] frequency divider according to the first embodiment of the present invention or the 1/[2m+1] frequency divider according to the second embodiment. The counter 25 obtains the 1/[2n+1] frequency-divided signal according to the first embodiment of the present invention or the 1/[2m+1] frequency-divided signal according to the second embodiment.

The operation of the odd-number frequency divider concerned will be described. For example, when the clock signal Sin is inputted in the odd-number frequency divider 24, this signal Sin is frequency-divided at 1/[2n+1] by the odd-number frequency divider 24. The 1/[2n+1] frequency-divided signal or the 1/[2m+1] frequency-divided signal whose waveform is shaped at the duty ratio of 50% is outputted to the counter 25.

Upon receipt of this signal, a digital frequency-divided signal Sout having an optional frequency division ratio and an optional duty ratio is outputted by the counter 25.

Thus, according to an odd-number frequency divider according to the sixth embodiment of the present invention, a counter 25 having an optional frequency division ratio is connected at the final stage of 1/[2n+1] frequency divider according to the first embodiment of the present invention or the 1/[2m+1] frequency divider according to the second embodiment as shown in FIG. 32.

As a result, it becomes possible to frequency-divide the clock signal Sout having an optional frequency division ratio and a duty ratio of 50% outputted from the odd-number frequency divider 24 at an optional frequency division ratio by means of the counter 25.

With this, it becomes possible to operate a circuit element by the digital frequency-divided signal Sout having an optional duty ratio when an integrated circuit which receives a high speed clock signal for operation is designed. This fact contributes greatly to high performance and high function of a data processing unit thereof similarly to the fifth embodiment.

(7) Description of the Seventh Preferred Embodiment

Being different from the fifth embodiment and the sixth embodiment, optional counters are provided at the front stage and at the final stage of an odd-number frequency divider in a seventh preferred embodiment.

Figure 33:
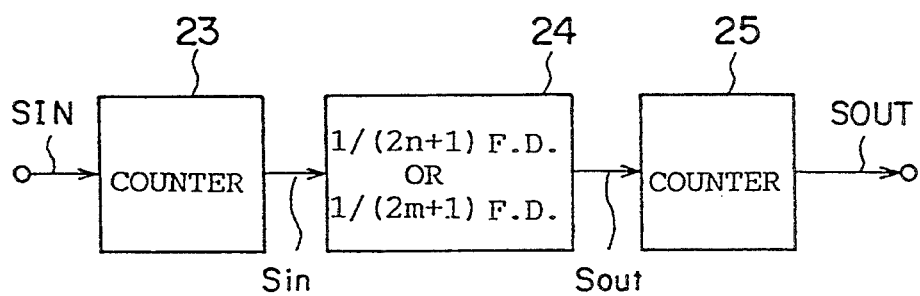
FIG. 33 is a structural diagram of an odd-number frequency divider according to a seventh preferred embodiment of the present invention.

For example, as shown in FIG. 33, an optional counter 23 is connected at the front stage of the odd-number frequency divider 24 and an optional counter 25 is connected at the final stage thereof. Here, the odd-number frequency divider 24 is the 1/[2n+1] frequency divider according to the first embodiment of the present invention or the 1/[2m+1] frequency divider according to the second embodiment. Other structures and method of connection are similar to those in the fifth embodiment and the sixth embodiment. Hence, the description thereof is omitted.

The operation of the odd-number frequency divider concerned will be described. For example, when a high speed clock signal SIN is inputted to the counter 23, this signal SIN is frequency-divided at an optional frequency division ratio, and the clock signal Sin thereof is outputted to the odd-number frequency divider 24. Upon receipt of the signal Sin, a digital frequency-divided signal Sout having a frequency division ratio of 1/[2n+1] or 1/[2m+1] and a duty ratio of 50% is outputted from the frequency divider 24 to an optional counter 25.

In the counter 25 which has received the digital frequency-divided signal SOUT, a digital frequency-divided signal Sout having an optional frequency division ratio and an optional duty ratio is outputted.

Thus, according to an odd-number frequency divider according to the seventh embodiment of the present invention, the counter 23 having an optional frequency division ratio is connected at the front stage of the 1/[2n+1] frequency divider according to the first embodiment of the present invention or the 1/[2m+1]

frequency divider according to the second embodiment, and the counter 25 having an optional frequency division ratio is connected at the final stage thereof.

As a result, it becomes possible to frequency-divide a high speed clock signal SIN into a clock signal Sout having a wide range of duty ratio by means of the counter 23 and the counter 25 as compared with the odd-number frequency divider according to the fifth embodiment.

With this, this fact contributes greatly to provision of a clock generator or the like for operating a data processing unit of high performance and high function.

Besides, it becomes possible to constitute an odd-number frequency divider having a wide variety of optional frequency division ratios by combining odd-number frequency dividers according to the first embodiment to the seventh embodiment of the present invention. With this, it becomes possible to frequency-divide the high speed clock signal SIN into clock signals having a wide variety of duty ratios. Accordingly, all of modifications within the true spirit and the range of the present invention are to be included in the scope of claims for a patent.

What is claimed is:

1. An odd-number frequency divider comprising:
   a counter having cascade-connected n (n=1, 2, 3) elements of flip-flop circuits, said counter receiving an input signal having a predetermined frequency and outputting a 1/(2n+1) frequency-divided signal of said input signal;
   a register having cascade-connected n (n=1, 2, 3) elements of flip-flop circuits, said counter receiving said 1/(2n+1) frequency-divided signal from said counter and shifting thereof successively and synchronously with said input signal;
   a latch circuit for holding a register output signal from the (n−1)th flip-flop circuit in said register synchronously with an inverted signal of said input signal; and
   a logic circuit which receives an inverted latch output signal from an inverted output terminal of said latch circuit and a register output signal from the nth flip-flop circuit in said register so as to output a 1/(2n+1) frequency-divided signal of said input signal.

2. An odd-number frequency divider according to claim 1, wherein said counter further has (n−1) switching elements, each of which is provided between flip-flop circuits adjoining each other in said counter, and wherein said register further has (n−1) switching elements, each of which is provided between flip-flop circuits adjoining each other in said register.

3. An odd-number frequency divider according to claim 1, wherein said logic circuit includes a two-input NAND circuit or a two-input NOR circuit for receiving an inverted latch output signal and a register output signal and outputting a 1/(2n+1) frequency-divided signal.

4. An odd-number frequency divider according to claim 1, wherein said counter further comprises (n−1) switching elements, each of which is provided between flip-flop circuits adjoining each other in said counter.

5. An odd-number frequency divider according to claim 1, wherein said register further comprises (n−1) switching elements, each of which is provided between flip-flop circuits adjoining each in said register.

6. An odd-number frequency divider according to claim 1, further comprising a second counter for dividing the frequency of said input signal into an optional ratio, said second counter being provided in front of said counter.

7. An odd-number frequency divider according to claim 1, further comprising a third counter for dividing a frequency of an output signal from said logic circuit into an optional ratio, said third counter being provided next to said logic circuit.

8. A method of constituting a programmable odd-number frequency divider, comprising the steps of:
   arranging on the same chip n (n=1,2,3) elements of flip-flop circuits for forming a counter in which data input terminals and data inverted output terminals are connected with one another and clock input terminals and data non-inverted output terminals are opened, and n pieces of flip-flop circuits for forming a register in which data input terminals, clock input terminals, data non-inverted output terminals and data inverted terminals are opened;
   connecting clock non-inverted output terminals and clock input terminals with one another among said n pieces of flip-flop circuits for forming a counter, respectively, in accordance with a design requirement;
   connecting data non-inverted output terminals and data input terminals with one another among n pieces of flip-flop circuits for forming said register, respectively, and connecting clock input terminals of n pieces of flip-flop circuits for forming said register to a clock supply line in accordance with a design requirement; and
   connecting a data non-inverted output terminal of the nth flip-flop circuit for forming said counter and a data input terminal of the first flip-flop circuit for forming said register with each other in accordance with a design requirement.

9. An odd-number frequency divider comprising:
   a counter having cascade-connected m (m=3,4,5, ... ) elements of flip-flop circuits, said counter receiving an input signal having a predetermined frequency and outputting a 1/(2m+1) frequency-divided signal of said input signal;
   a register having cascade-connected (m+1) elements of flip-flop circuits, said counter receiving said 1/(2m+1) frequency-divided signal from said counter and shifting thereof successively and synchronously with said input signal;
   a latch circuit for holding a register output signal from the mth flip-flop circuit of the register synchronously with an inverted signal of said input signal; and
   a logic circuit which receives an inverted latch output signal from an inverted output terminal of said latch circuit and a register output signal of the (m+1)th flip-flop circuit in said register so as to output a 1/(2m+1) frequency-divided signal.

10. An odd-number frequency divider according to claim 9, wherein said counter further has (m−1) switching elements, each of which is provided between flip-flop circuits adjoining each other in said counter, and wherein said register further has m switching elements, each of which is provided between flip-flop circuits adjoining each other in said register.

11. An odd-number frequency divider according to claim 9, wherein said logic circuit has a two-input NAND circuit or a two-input NOR circuit for receiving an inverted latch output signal and a register output signal and outputting a 1/(2m+1) frequency-divided signal.

12. An odd-number frequency divider according to claim 9, wherein said counter further comprises (m−1) switching elements, each of which is provided between flip-flop circuits adjoining each other in said counter.

13. An odd-number frequency divider according to claim 9, wherein said register further comprises m switching elements, each of which is provided between flip-flop circuits adjoining each other in said register.

14. An odd-number frequency divider according to claim 9, further comprising a second counter for dividing the frequency of said input signal into an optional ratio, said second counter being provided in front of said counter.

15. An odd-number frequency divider according to claim 9, further comprising a third counter for dividing a frequency of an output signal from said logic circuit into an optional ratio, said third counter being provided next to said logic counter.

16. A method of constituting a programmable odd-number frequency divider, comprising the steps of:

arranging on the same chip m (m=3,4,5...) elements of flip-flop circuits for forming a counter in which data input terminals and data inverted output terminals are connected with one another and clock input terminals and data non-inverted output terminals are opened, and (m+1) elements of flip-flop circuits for forming a register in which data input terminals, clock input terminals, data non-inverted output terminals and data inverted terminals are opened;

connecting clock non-inverted output terminals and clock input terminals with one another among said m pieces of flip-flop circuits for forming a-counter, respectively, in accordance with a design requirement;

connecting data non-inverted output terminals and data input terminals with one another among (m+1) pieces of flip-flop circuits for forming said register, respectively, and connecting clock input terminals of (m+1) pieces of flip-flop circuits for forming said register to a clock supply line in accordance with a design requirement; and connecting a data non-inverted output terminal of the mth flip-flop circuit for forming said counter and a data input terminal of the first flip-flop circuit for forming said register with each other in accordance with a design requirement.

* * * * *

UNITED STATES PATENT AND TRADEMARK OFFICE
CERTIFICATE OF CORRECTION

PATENT NO. : 5,438,600
DATED : August 1, 1995
INVENTOR(S) : Fusao SEKI et al.

It is certified that error appears in the above-indentified patent and that said Letters Patent is hereby corrected as shown below:

Column 2, line 55, delete "pieces" and insert --elements--.

Column 9, line 64, change "Q" to --$\overline{Q}$--.

Column 12, line 16, change "Q" to --$\overline{Q}$--.

Column 18, line 37, delete "pieces" and insert --elements--; and line 62, delete "pieces" and insert --elements--.

Column 19, line 29, delete "pieces" and insert --elements--; and line 62, delete ":" and insert -- = --.

Signed and Sealed this

Twenty-eighth Day of November 1995

BRUCE LEHMAN

Attest:

Attesting Officer

Commissioner of Patents and Trademarks